US006819975B2

(12) United States Patent
Watanabe

(10) Patent No.: US 6,819,975 B2
(45) Date of Patent: Nov. 16, 2004

(54) PRODUCTION CONTROLLING METHOD

(75) Inventor: Shinji Watanabe, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 118 days.

(21) Appl. No.: 10/166,689

(22) Filed: Jun. 12, 2002

(65) Prior Publication Data

US 2003/0144762 A1 Jul. 31, 2003

(30) Foreign Application Priority Data

Jan. 28, 2002 (JP) ........................................ 2002-018362

(51) Int. Cl.[7] .............................................. G06F 7/00
(52) U.S. Cl. ...................... 700/225; 700/116; 700/121
(58) Field of Search ................................ 700/215, 213, 700/225, 226, 116, 117, 121; 235/462.01

(56) References Cited

U.S. PATENT DOCUMENTS 6,303,899 B1 * 10/2001 Johnson et al. ......... 219/121.69
6,420,792 B1 *  7/2002 Guldi et al. ................. 257/797
6,431,447 B1 *  8/2002 Park et al. ............. 235/462.02
6,498,567 B1 * 12/2002 Grefenstette et al. ... 340/825.62
6,544,804 B2 *  4/2003 Yano et al. .................... 438/14
6,595,428 B2 *  7/2003 Eguchi et al. ............... 235/493

FOREIGN PATENT DOCUMENTS

| JP | 7-78206 | 3/1995 |
| JP | 11-231909 | 8/1999 |
| JP | 2000-293571 | 10/2000 |

* cited by examiner

Primary Examiner—Khoi H. Tran
(74) Attorney, Agent, or Firm—Oblon, Spivak, McClelland, Maier & Neustadt, P.C.

(57) ABSTRACT

Data on manufacturing processes in a semiconductor manufacturing apparatus mainly containing bar code data are input to a portable input unit in step S1. A main bar code label can be affixed to an extremely short bar-code-labeled component such as a reticle having only a very narrow bar-code to-be-labeled region, which enables data input by bar codes. The portable input unit is placed in a terminal in step S2, so that data input to the portable input unit are transferred to a production line terminal. The production line terminal performs a compiling process (production controlling process) in step S3 based on input data obtained from the portable input unit and master data obtained from a server. Consequently obtained are a production control system and a production controlling method capable of performing production control with high accuracy in which errors created by operators in data input are minimized.

3 Claims, 30 Drawing Sheets

F I G . 3
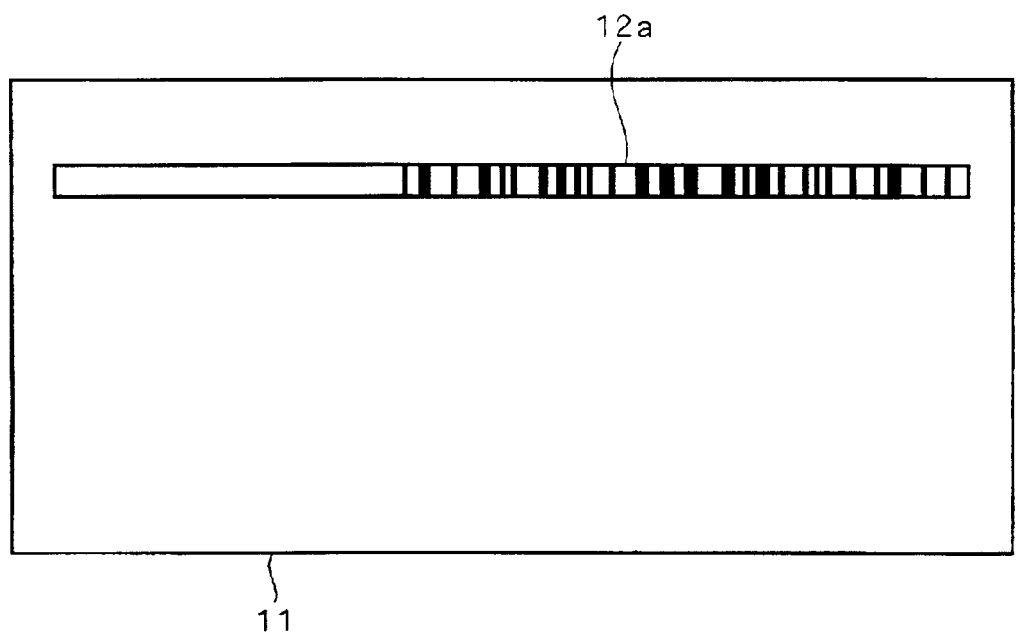

F I G . 2 2
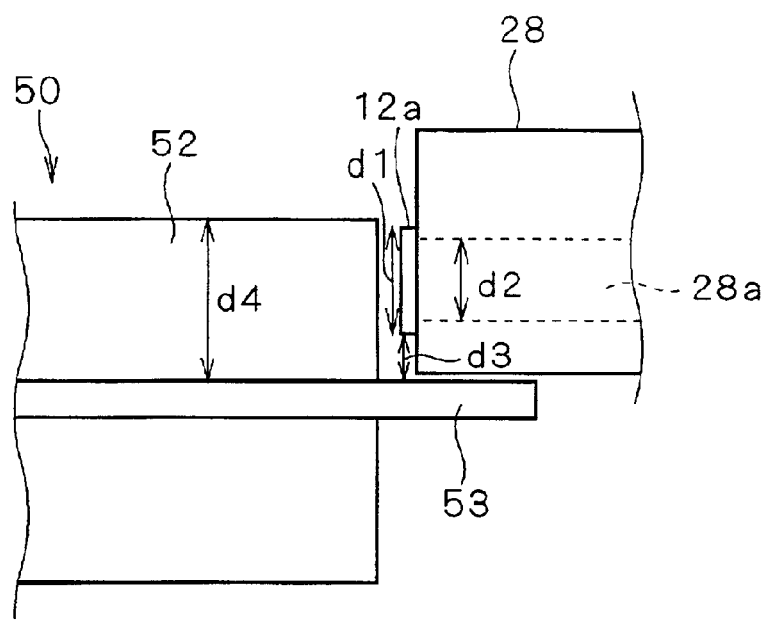
F I G . 2 3
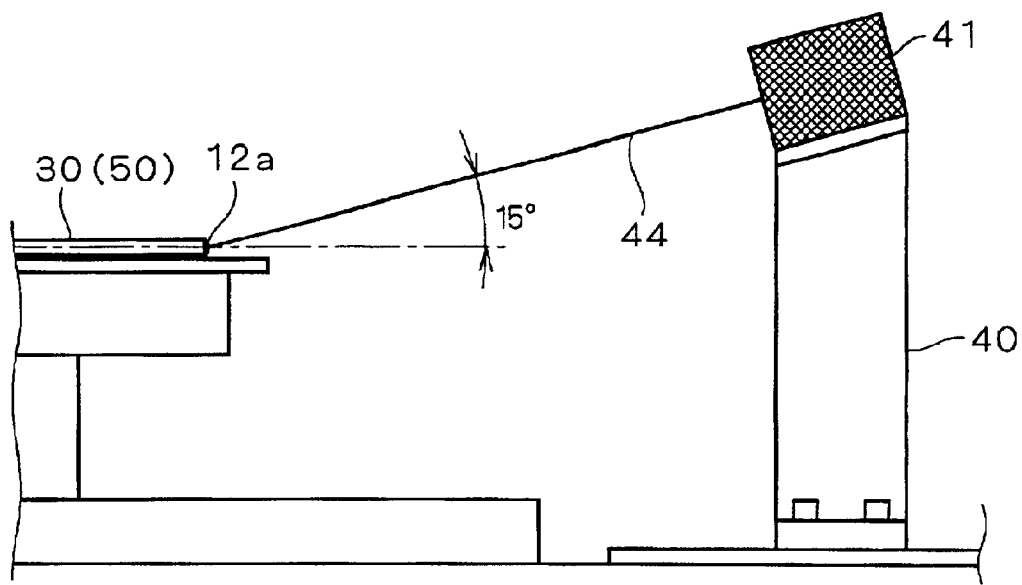

F I G . 2 4
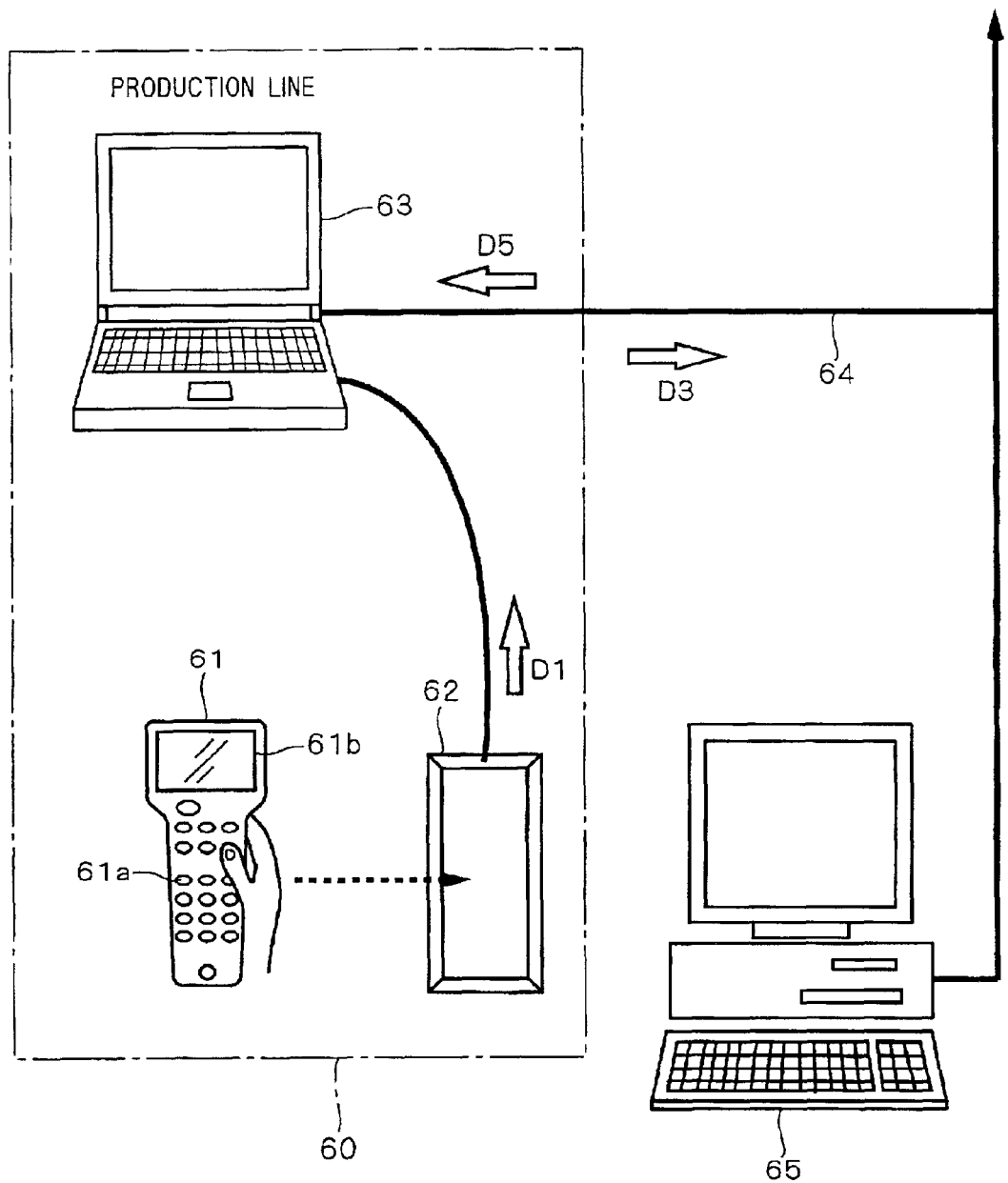

FIG. 26

| | | | | | | | | | | | | | |
|---|---|---|---|---|---|---|---|---|---|---|---|---|---|
| | | | | DATA FORM A (No.0275) | | | DATA FORM No. | M-E75 | | | | | |
| | | | | | | | | | KEY No. | K | M | E | 7 5 2 4 |
| | | | | | | | | | LOT No. | K | A | S | 8 5 4 0 |
| | | | CHIP NAME C50941-789W | | | | | | | | | | |
| C-SI-38J-4 | | AA50941WR789W FA | | | | | | 52N | | | | | 5.0 |
| THE NUMBER OF PRODUCTS 25 | | THE NUMBER OF PRODUCTS | | WAFER | \<P\> | \<100\> | 17.0 | 23.0 | | | | GK03316 | |
| PROCESS | OPERATION NAME | DESIGNATED DATE | COMPLETED DATE | OPERATOR | QC DATA | PROCESS | OPERATION NAME | DESIGNATED DATE | COMPLETED DATE | | THE NUMBER OF PRODUCTS | OPERATOR | QC DATA |
| | ... | ... | ... | ... | ... | | ... | ... | ... | | ... | ... | ... |
| | ... | ... | ... | ... | ... | | ... | ... | ... | | ... | ... | ... |
| | ... | ... | ... | ... | ... | | ... | ... | ... | | ... | ... | ... |
| ... | ... | ... | ... | ... | ... | | ... | ... | ... | | ... | ... | ... |

FIG. 27

SP-1 (ETCHING DEPOSITION) CODE LIST

| ① Ar PRESSURE | ② VOLTAGE | ③ FILM THICKNESS | ④ FOREIGN SUBSTANCE | ⑤ FILM THICKNESS DIFFERENCE |
|---|---|---|---|---|
| 3.5 | 420 | 9000 | 1 | 10 |
| 3.6 | 425 | 9050 | 2 | 20 |
| 3.7 | 430 | 9100 | 3 | 30 |
| 3.8 | 435 | 9150 | 4 | 40 |
| 3.9 | 440 | 9200 | 5 | 50 |
| 4 | 445 | 9250 | 6 | 60 |
| 4.1 | 450 | 9300 | 7 | 70 |
| 4.2 | 455 | 9350 | 8 | 80 |
| 76a | 76b | 76c | 76d | 76e |

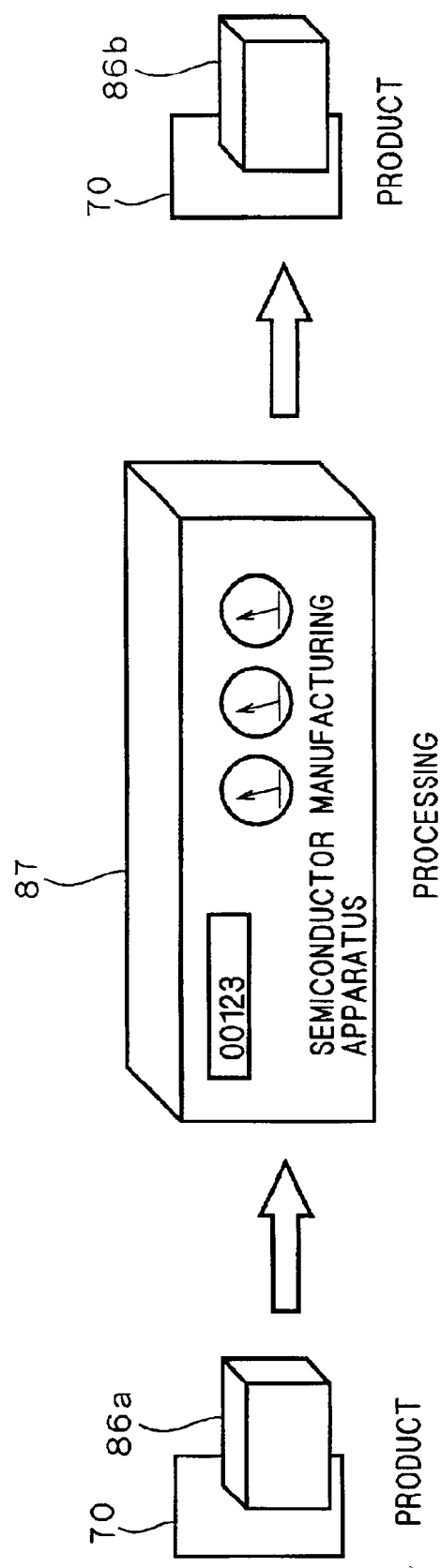

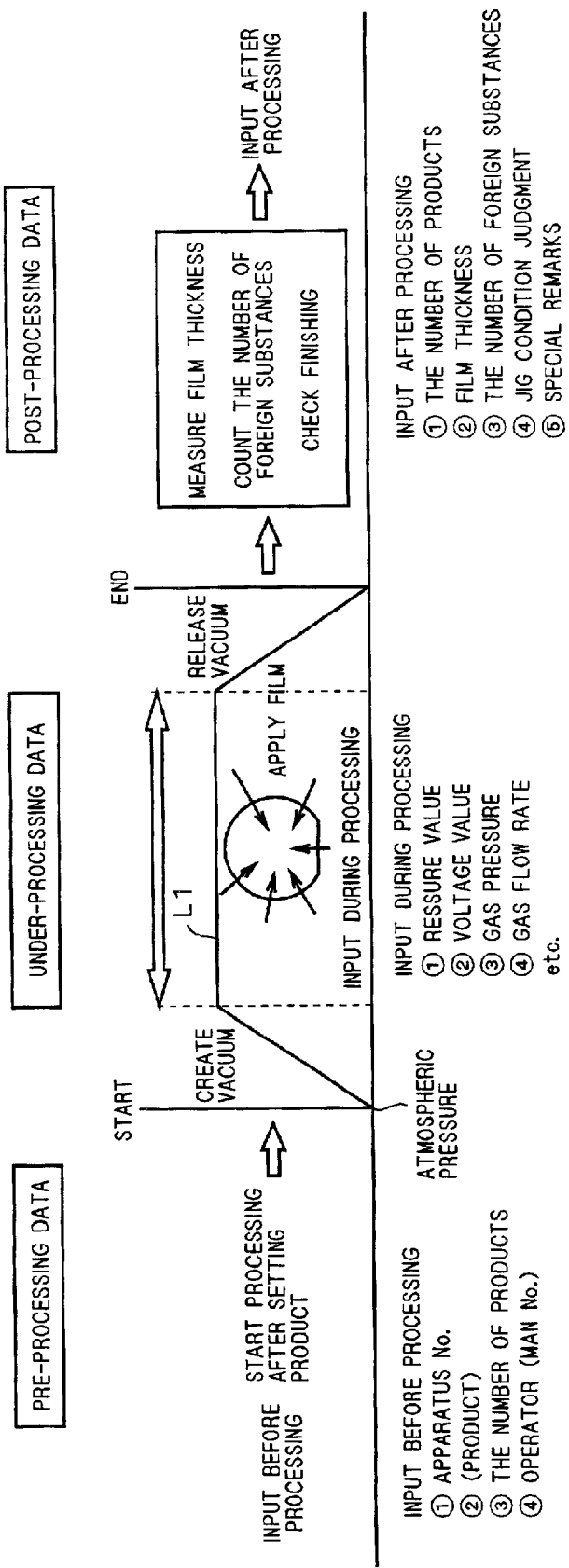

FIG. 32

MAY 2001  APPARATUS No. SP-2

| DATE | START TIME | KEY No. | MODEL NAME / LOT No. | THE NUMBER OF PROCESSED PRODUCTS | OPERATOR | THE NUMBER OF GOOD PRODUCTS | CL HEATING TEMPERATURE °C | DC1 POWER 10±2 kw / QUANTITY CONSUMED 350kwh OR LESS | DC1 VOLTAGE | SP Ar PRESSURE 2.5±0.3 mTorr / Ar FLOW RATE 65±10 cc/min | FILM THICKNESS (Å) 36000±3000 Å | THE NUMBER OF ADHERING FOREIGN SUBSTANCES 10/w OR LESS | ABNORMAL DISCHARGE CHECK | REMARKS |
|---|---|---|---|---|---|---|---|---|---|---|---|---|---|---|
| EX. | 7:00 | KKZ123000 | C5056304-235W,AS23100 | 25 | AOKI | 25 | 168 | 9.6 | 522 | 2.5/65 | 10000 | 6 | ○ | |
| 5/2 | 8:52 | CV154 | – | 1 | MATSUNO | 1 | 150 | 4.9/214 | 463 | 2.4/65 | 10400 | 3 | ○ | |
| 5/2 | 9:58 | KBR286000 | C62446W F52A FB13100 | 25 | WATANABE | 25 | 150 | 4.9 | 0 | 2.4/65 | 10400 | 0 | ○ | |
| 5/2 | 10:22 | KBRT25000 | C62446W F52A FB13700 | 25 | SAKAGAMI | 25 | 150 | 4.9 | 0 | 2.4/65 | 10400 | 0 | ○ | |
| 5/2 | 11:02 | KBRT26000 | C62446W F52A FB13800 | 25 | MURAKAMI | – | – | – | – | –/– | – | – | – | |

PRE-PROCESSING | UNDER-PROCESSING | POST-PROCESSING

APPROVAL

F I G . 3 3
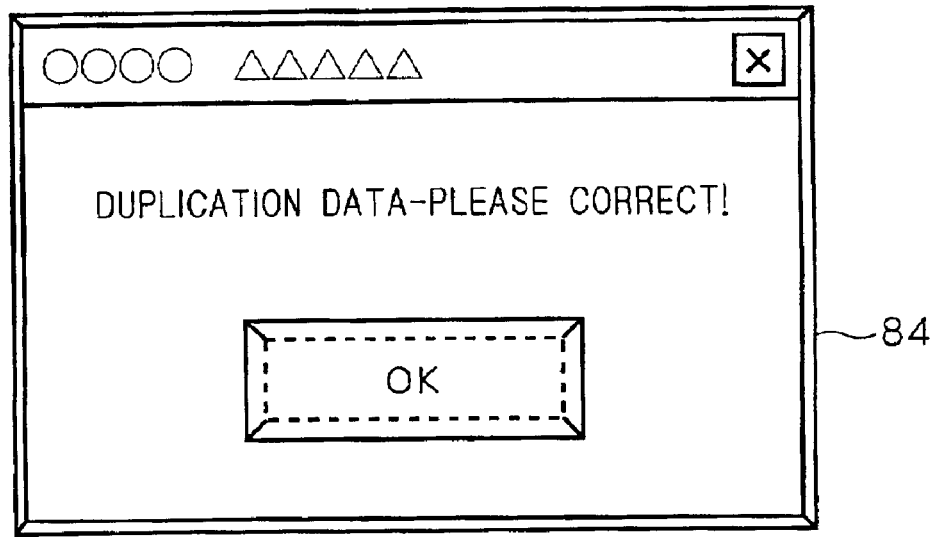

FIG. 34

DECEMBER 2000    APPARATUS No.: SP-1

| DATE | START TIME | MODEL NAME / LOT No. | THE NUMBER OF PROCESSED PRODUCTS | THE NUMBER OF GOOD PRODUCTS | CL HEATING TEMPERATURE °C | DC1 POWER 5.0±1.0 kw / QUANTITY CONSUMED SP-1:390 SP-2:370 SP-3:350 kwh OR LESS | DC1 VOLTAGE 460±60 V | SP Ar PRESSURE 2.5±0.3 mTorr / Ar FLOW RATE 65±10 cc/min | FILM THICKNESS (Å) 7000±700 Å / 8500±1000 Å / 10500±1000 Å | THE NUMBER OF ADHERING FOREIGN SUBSTANCES 10/w OR LESS | FILM THICKNESS DIFFERENCE MAXIMUM-MINIMUM 1000 Å OR LESS | ABNORMAL DISCHARGE CHECK | NAIL MARK CHECK | REMARKS | OPERATOR |
|---|---|---|---|---|---|---|---|---|---|---|---|---|---|---|---|
| EX. | 7:00 | C50945-147N | 25 | 25 | 152 | 5.3 | 439 | 2.5/65 | | | 200 | ○ | ○ | | TAKAKURA |
| 12/1 | 0:00 | C50945-147W | 25 | 25 | 153 | 4.5/300 | 400 | 2.2/66 | | | 500 | ○ | ○ | | AOKI |
| 12/1 | 2:00 | C60733-155W | 25 | 25 | | 5.1 | | 2.2/65 | | | 100 | × | ○ | | SAKAGAMI |
| 12/1 | 4:00 | C50945-148W | 25 | 25 | | 5.0 | | 2.4/66 | | | 150 | ○ | ○ | | MATSUNO |
| ... | ... | ... 91a | ... | ... | ... | ... | ... | ... | ... | ... | ... | ... | ... | | ... |

91

Approval: N / GL

US 6,819,975 B2

PRODUCTION CONTROLLING METHOD

BACKGROUND OF THE INVENTION

1. Field of the Invention

The present invention relates to a production control system, and more particularly to a production control system in semiconductor production lines.

2. Description of the Background Art

In production lines, forms copied from original sheets of paper have been prepared by apparatus and parameter, each of which are placed in a predetermined position near a corresponding apparatus. Such forms are provided to record, as histories, vacuum values, gas pressures, flow rates, film thickness values, foreign substance events and the like with respect to actually processed products of each model name and lot number in a product processing apparatus for performing control, thereby maintaining product quality.

Recording has been conducted by each batch (a unit of processing) by manually filling in the forms with: dates, chip names, lot numbers and man numbers when inputting products to an apparatus for processing; indicated values of each measuring instrument of the apparatus during processing; and film thickness values, the number of foreign substances, special remarks and the like with respect to processed products.

FIG. 34 is a table showing an SCF (Sort Circle Feedback) sheet 91 which is one of the above-mentioned forms. As shown in the table, a manual data input region 91a on the SCF sheet 91 is filled in by handwriting with data containing model names (chip names) and lot numbers by operators.

Operating conditions in conventional production lines have been recorded manually as described above, which have caused problems in that operation errors including miswriting, overlooking of out-of-spec values and mistaking of lots.

SUMMARY OF THE INVENTION

An object of the present invention is to obtain a production control system and a production controlling method capable of performing production control with high accuracy in which errors created by operators in data input are minimized.

According to a first aspect of the present invention, the production control system relates to manufacturing processes in a semiconductor manufacturing apparatus including a bar-code-labeled component provided with a bar code defining identification information. The bar-code-labeled component includes an extremely short bar-code-labeled component having a bar code label affixed thereto. The bar code label is printed with a bar code of not more than 3 mm in height. The production control system includes a data input unit and a data processor. The data input unit has portability and inputs data on the manufacturing processes of the semiconductor manufacturing apparatus, and has a bar code reading function for reading the bar code on the bar code label and inputting identification information of the extremely short bar-code-labeled component. The data on the manufacturing processes include the identification information of the extremely short bar-code-labeled component. The data processor reads out the data on the manufacturing processes inputted to the data input unit, thereby performing production control based on the data on the manufacturing processes.

The bar code reading function of the data input unit allows identification information to be read out from the bar code printed on the extremely short bar-code-labeled component as data on the manufacturing processes. Thus, errorless data input by bar code reading can be performed for a device having a bar-code-labeled region with the narrower width of approximately 3.0 mm, which allows production control to be performed with higher accuracy.

According to a second aspect of the invention, the production controlling method relates to manufacturing processes in a semiconductor manufacturing apparatus including a bar-code-labeled component provided with a bar code defining identification information. The bar-code-labeled component includes an extremely short bar code labeled component having a bar code label affixed thereto. The bar code label is printed with a bar code of not more than 3 mm in height. The production controlling method includes the following steps (a) and (b). The step (a) is to read out data on the manufacturing processes in the semiconductor manufacturing apparatus. The data on the manufacturing processes include identification information of the extremely short bar-code-labeled component obtained by reading the bar code on the bar code label. The step (b) is to perform production control based on the data on the manufacturing processes.

The step (a) is executed so that identification information can be read out from the bar code printed on the extremely short bar-code-labeled component as data on the manufacturing processes. Thus, errorless data input by bar code reading can be performed for a device having a bar-code-labeled region with the narrower width of approximately 3.0 mm, which allows production control to be performed with higher accuracy.

According to a third aspect of the invention, the production controlling method relates to manufacturing processes in a semiconductor manufacturing apparatus and includes the following steps (a) and (b). The step (a) is to read out data on the manufacturing processes. The data on the manufacturing processes include at least one of operator identification information obtained by reading one bar code defining an operator and inspection value information obtained by reading the other bar code defining an inspection value. The step (b) is to perform production control based on the data on the manufacturing processes.

The step (a) is executed so as to read out, as data on the manufacturing processes, at least one of the operator identification information obtained by reading one bar code defining the operator and the inspection value information obtained by reading the other bar code defining the inspection value. Thus, data can be input without errors created by the operator or errors in measured values, which allows production control to be performed with higher accuracy.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is an explanatory view showing the bar code label sheet (without the temporary bar code label);

FIG. 22 is a sectional view showing the process of affixing the main bar code label;

FIG. 23 is an explanatory view showing a process of reading the main bar code label;

FIG. 24 is an explanatory view showing a structure of a production control system of an embodiment of the present invention;

FIG. 26 is an explanatory view showing an example of a data form;

FIG. 27 is an explanatory view showing an example of a bar code list;

FIG. 30 is an explanatory view showing the concept of a pre-processing product, an under-processing product and a post-processing product;

FIG. 31 is an explanatory view showing examples of pre-processing data, under-processing data and post-processing data;

FIG. 32 is an explanatory view showing an example of a compiling table;

FIG. 33 is an explanatory view showing an example of an error message; and

FIG. 34 is an explanatory view showing a form of an SCF sheet.

DESCRIPTION OF THE PREFERRED EMBODIMENTS

<Problem with Bar-Coding of a Semiconductor Manufacturing Apparatus>

It is desired to bar-code a semiconductor manufacturing apparatus including components, thereby achieving device identification without input errors.

Bar codes used for component identification include the JAN (Japanese Article Number) code used for consumer products. As a worldwide code, the ITF bar code is certified by JIS (Japanese Industrial Standard) as a standard distribution bar code. As industrial bar codes, the CODE 39 code, the NW-7 code, the CODE 128 code and the like are currently used for many components. Identification of these bar codes with bar code readers achieves data input without errors.

However, the JAN bar code that can only represent a predetermined number of digits is limited in the number of types it can represent. On the other hand, a bar code such as the CODE 39 code, the NW-7 code or the CODE 128 code that can represent any number of digits is so long that a drawback arises, for example, in that it cannot be labeled on a target component having a short bar-code to-be-labeled region.

The necessity of precisely affixing a bar code label limits a printed height of the bar code to approximately 3 mm. However, some components of a semiconductor manufacturing apparatus including a reticle are of approximately 3 mm in height. Bar code labels cannot be affixed to such components of a narrow printed width with high accuracy, which makes it impossible in semiconductor manufacturing plants to achieve full-scale bar-coding of a semiconductor manufacturing apparatus including components.

<Basic Principles>

(Preparation of Bar Code Label Sheet)

Figure 1:
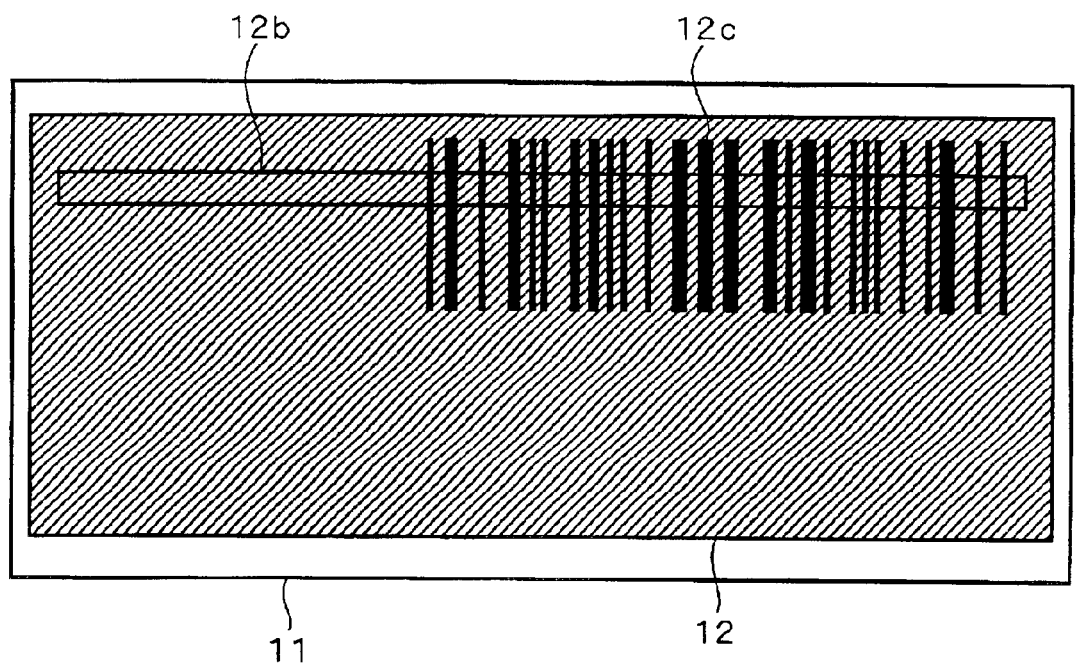
FIG. 1 is an explanatory view showing a bar code label sheet (with a temporary bar code label)

FIG. 1 is an explanatory view showing a bar code label sheet (with a temporary bar code label) for use in a bar code label affixing apparatus which is a first basic principle of the present invention.

As shown in FIG. 1, a temporary bar code label 12 is affixed to a main region of a sheet 11, and a rectangular slit 12b with a narrow vertical width and a long horizontal width is provided on an upper part of the temporary bar code label 12. A bar code 12c consisting of a plurality of bars is printed in a region including the vertical width of the slit 12b. Printing of the bar code 12c is conducted by a predetermined printer.

Figure 2:
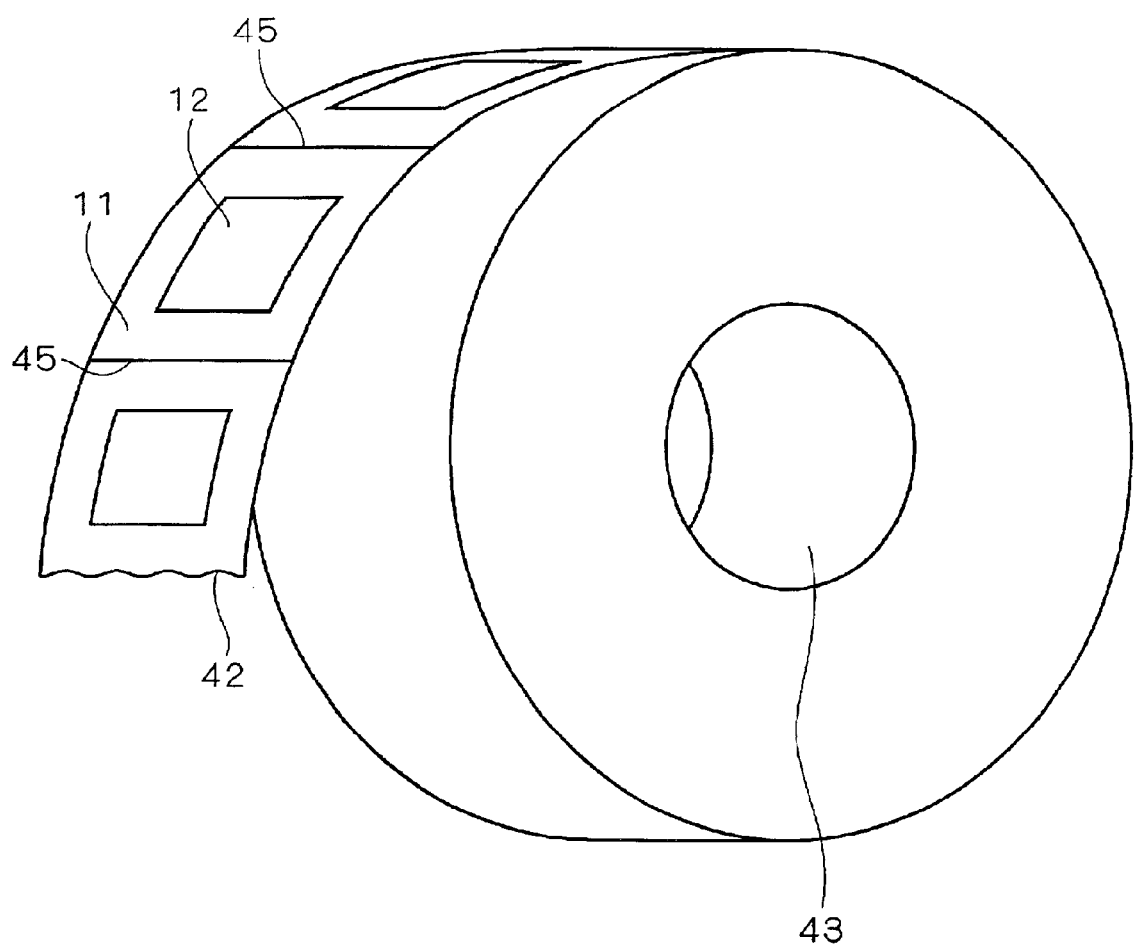
FIG. 2 is an explanatory view showing a roll of sheet for the bar code label sheet.

FIG. 2 is an explanatory view showing a roll of sheet 42 for the sheet 11. As shown in the drawing, the roll of sheet 42 is rolled up around a core 43. The core 43 is made of a clean-room-ready material such as synthetic resin. By cutting the roll of sheet 42 at a cutting line 45, the sheet 11 with the temporary bar code label 12 shown in FIG. 1 is obtained.

FIG. 3 is an explanatory view showing a bar code label sheet (without the temporary bar code label) for use in the bar code label affixing apparatus which is the first basic principle of the invention.

Removal of the temporary bar code label 12 in the state shown in FIG. 1 from part other than the slit 12b leads to a state shown in FIG. 3 in which only a main bar code label 12a is affixed to the sheet 11. That is, a region inside the slit 12b of the temporary bar code label 12 is left as the main bar code label 12a. The main bar code label 12a is a narrow rectangular bar code label with its longer side being considerably longer than its shorter side and with its front face printed with a bar code and its back face being an adhesive face.

The temporary bar code label 12 is removed by hand or using a dedicated removing apparatus. In this case, the to-be-removed region (i.e., the region of the temporary bar code label 12 other than the region in the slit 12b) is relatively large, so that manual removal causes few problems.

Next, an end of the main bar code label 12a is removed by approximately 5 to 10 mm so that the main bar code label 12a can easily be removed form the sheet 11 by the bar code label affixing apparatus according to the basic principle (bar code label partly removing operation).

(Bar Code Label Affixing Apparatus)

Figure 4:
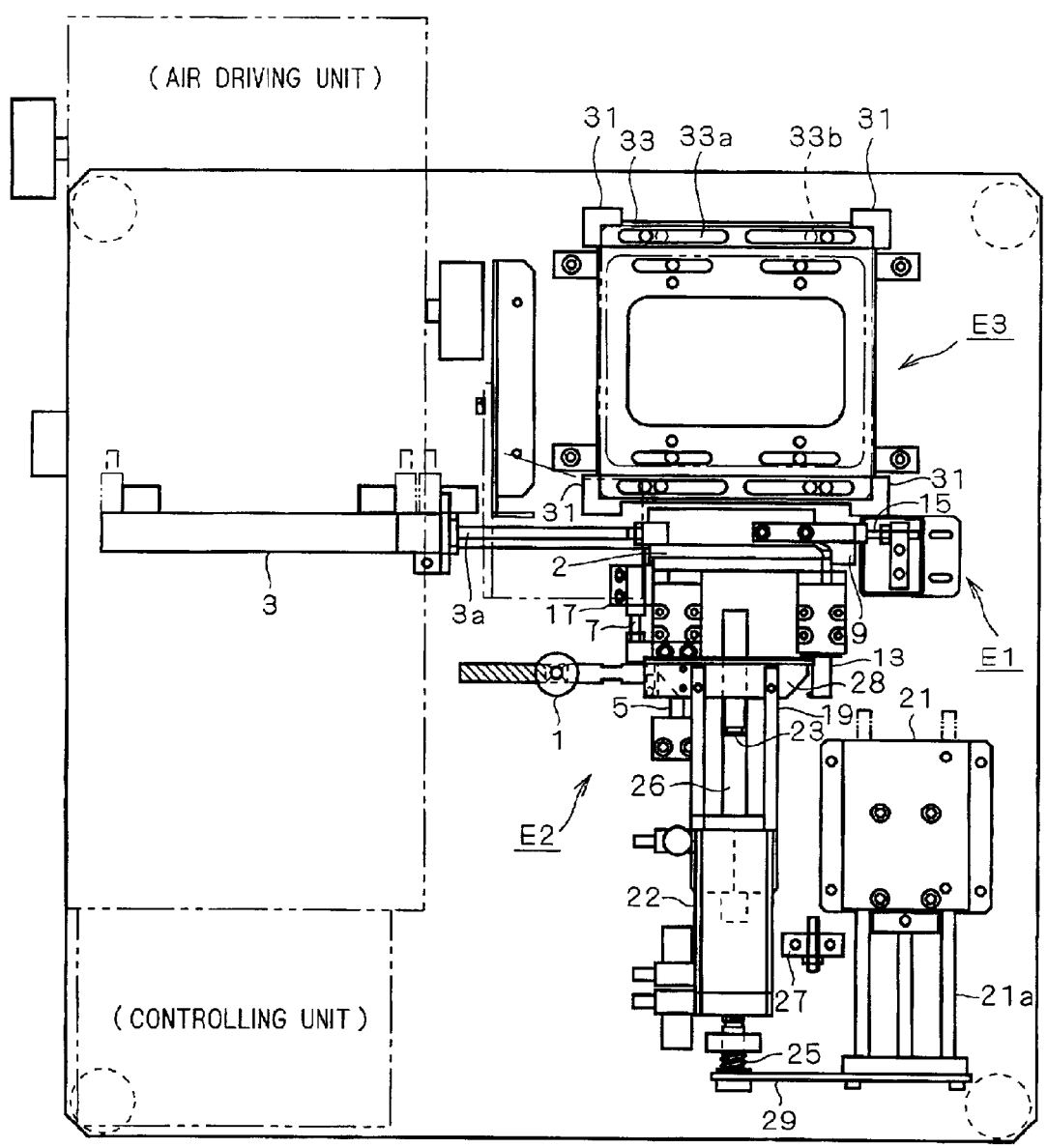
FIG. 4 is a plan view showing the whole structure of a bar code affixing apparatus according to a basic principle.

FIG. 4 is a plan view showing the whole structure of the bar code affixing apparatus according to the basic principle. As shown in the drawing, the bar code label affixing apparatus is composed of a bar code receiving mechanism E1 including a backing plate 2, a cylinder 3 and the like, a bar code adsorbing mechanism E2 including cylinders 21 and 22, an adsorbing part 28 and the like, and a work holding mechanism E3 including an adsorbing block 33 and the like. Further description of the bar code receiving mechanism E1, the bar code adsorbing mechanism E2 and the work holding mechanism E3 will be made later. Description of an air driving unit and a controlling unit almost irrelevant to the present invention is omitted in this specification.

(Bar Code Receiving Operation)

Figure 5:
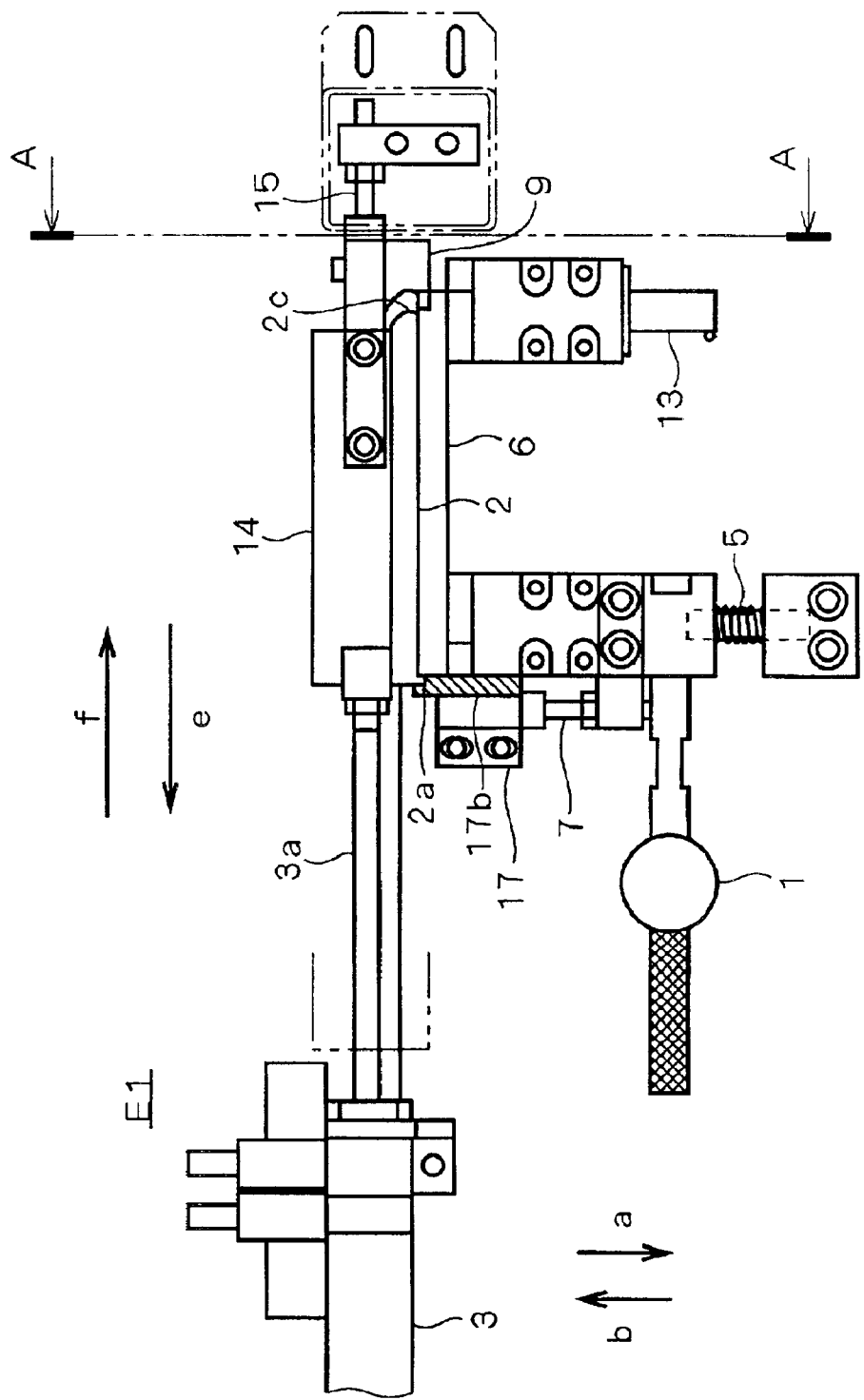
FIG. 5 is a plan view showing a detailed structure of a bar code receiving mechanism.
Figure 6:
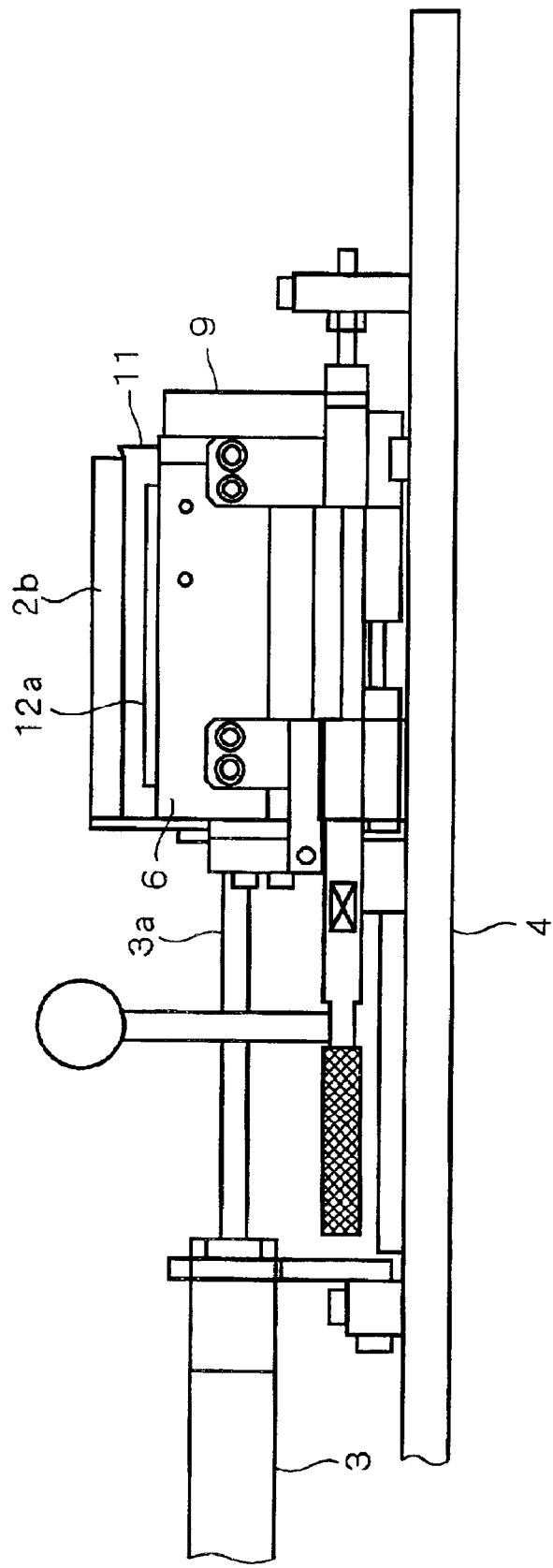
FIG. 6 is a front view showing the detailed structure of the bar code receiving mechanism.
Figure 7:
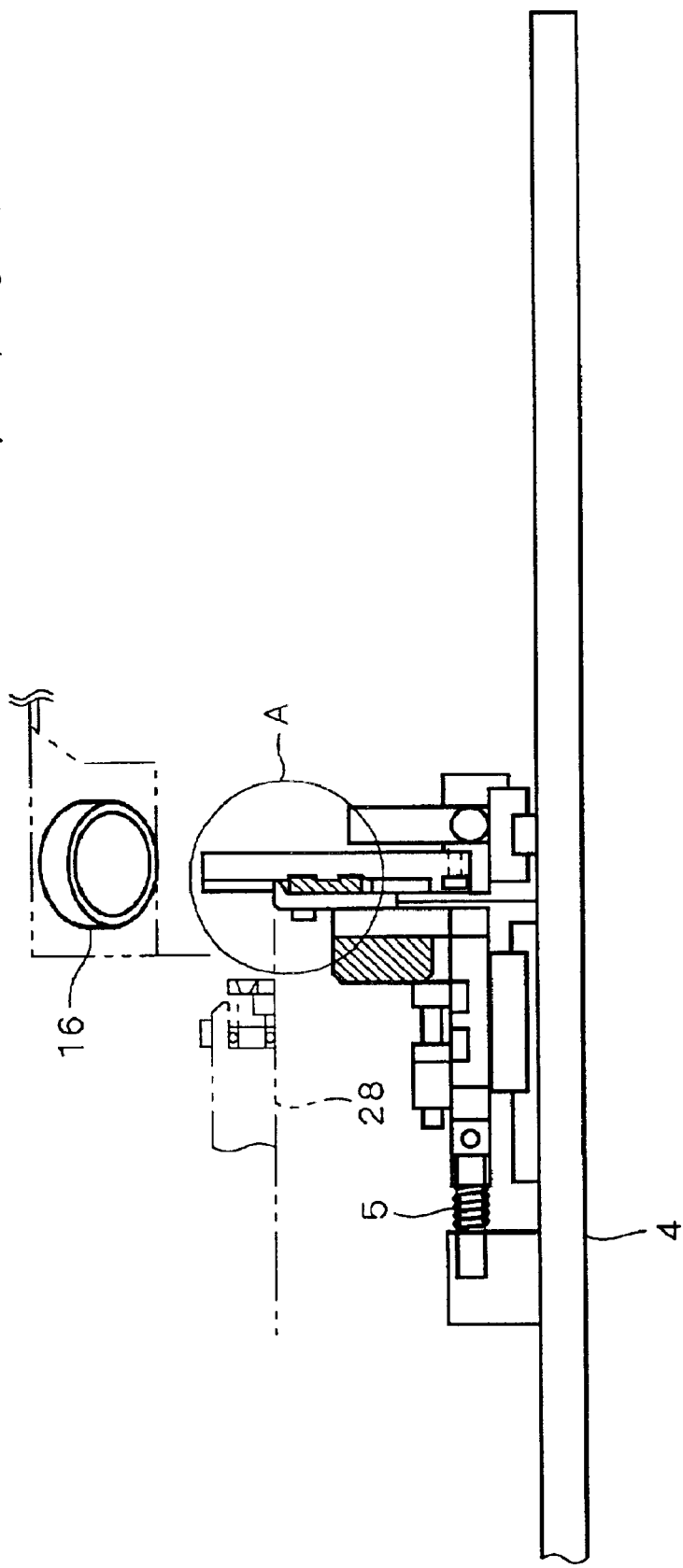
FIG. 7 is a sectional view taken along the line A—A of FIG. 5.
Figure 8:
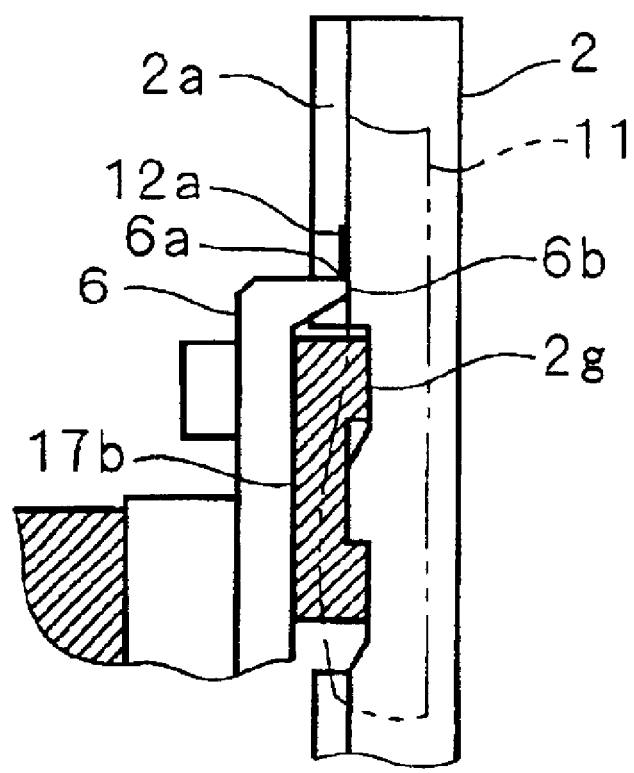
FIG. 8 is an enlarged sectional view showing part of FIG. 7.

FIGS. 5 through 8 show a detailed structure of the bar code receiving mechanism E1. FIG. 5 is a plan view, FIG. 6 is a front view, FIG. 7 is a sectional view taken along the line A—A of FIG. 5, and FIG. 8 is an enlarged sectional view showing part of FIG. 7 denoted by A.

As shown in these drawings, the bar code receiving mechanism E1 includes a lever 1, the backing plate 2, the cylinder 3, a positioning plate 6, an adjustment bolt 7, an R guide 9, a bearing 13, a receiving base 14, a stopper bolt 15, a stopper bracket 17 and the like, all of which are provided on a base board 4.

The backing plate 2 and the R guide 9 are fixed onto the receiving base 14. The receiving base 14 is connected with a cylinder rod 3a so as to be movable in directions of arrows e and f shown in FIG. 5. The movement of the receiving base 14 in the direction of the arrow f is limited by the stopper bolt 15.

The backing plate 2 extending in the direction of the arrow e (or f) has a backing plate L portion 2a on its left edge (on the cylinder 3 side) projecting in a direction of an arrow a and a backing plate R portion 2c on its right edge (on the stopper bolt 15 side) which is an arc-shaped projection. The R guide 9 with a recessed arc-shaped side face is arranged to be opposed to the backing plate R portion 2c.

The positioning plate 6 can be moved through the bearing 13 by pulling the lever 1 in the direction of the arrow a or b. That is, pulling the lever 1 in the direction of the arrow a allows the positioning plate 6 to move away from the backing plate 2, and pulling the lever 1 in the direction of the arrow b can bring the positioning plate 6 into intimate contact with the backing plate 2 to such an extent that the sheet 11 can be held therebetween. The spring 5 always exerts force on the positioning plate 6 toward the direction of the arrow b. The height of the positioning plate 6 is determined to be less than that of the backing plate 2 and the horizontal width of the sheet 11.

A sheet receiving operation by the bar code receiving mechanism E1 will be described below in reference to FIGS. 5 to 8.

In a state in which the lever 1 remains pulled in the direction of the arrow a shown in FIG. 5, i.e., a state in which the backing plate 2 and the positioning plate 6 are placed at an enough spacing for the sheet 11 to be inserted therebetween, the sheet 11 is inserted sideways as shown in FIG. 6 in such a manner that its back side is opposed to a backing plate flat portion 2b of the backing plate 2 while its front side (on which the main bar code label 12a is present) is opposed to the positioning plate 6 and that the main bar code label 12a is present above. At this time, part of the sheet 11 on the side where the main bar code label 12a is partly removed is inserted in between the backing plate R portion 2c and the R guide 9.

The left side of the sheet 11 is entirely brought in engagement with the backing plate L portion 2a, so that lateral positioning of the sheet 11 is determined.

Next, the sheet 11 is raised in such a manner that a stopper portion 6a of the positioning plate 6 is located on a lower end of the main bar code label 12a as shown in FIG. 8, so that vertical positioning of the sheet 11 is determined while lateral positioning is maintained. In this state, the lever 1 is returned toward the direction of the arrow b to cause a sheet holding portion 6b to hold the sheet 11 present under the stopper portion 6a. Thus, the sheet 11 can be held on the backing plate flat portion 2b with lateral and vertical positioning thereof determined.

The positioning plate 6 is provided perpendicularly to the base board 4 with high surface accuracy, and the sheet holding portion 6b extending perpendicularly from an upper portion of the positioning plate 6 allows the sheet 11 to be held with high positional accuracy.

Further, as shown in FIGS. 5 and 8, the backing plate 2 has a backing plate groove portion 2g below the backing plate L portion 2a, and a lateral-sheet-position assisting plate 17b having a projection in a position opposed to the backing plate groove portion 2g is fixed onto the stopper bracket 17. Thus, the projection of the lateral-sheet-position assisting plate 17b and the backing plate groove portion 2g are fitted together, so that lateral positioning of the sheet 11 can be assisted.

FIG. 8 shows a state in which the sheet 11 is inserted in between the backing plate R portion 2c and the R guide 9. Therefore, the sheet 11 is largely held by the positioning plate 6 in a position parallel to the backing plate flat portion 2b.

The adjustment bolt 7 adjusts a spacing between the sheet holding portion 6b and the backing plate flat portion 2b so that these portions are opposed in parallel to each other with high dimensional accuracy.

Figure 9:
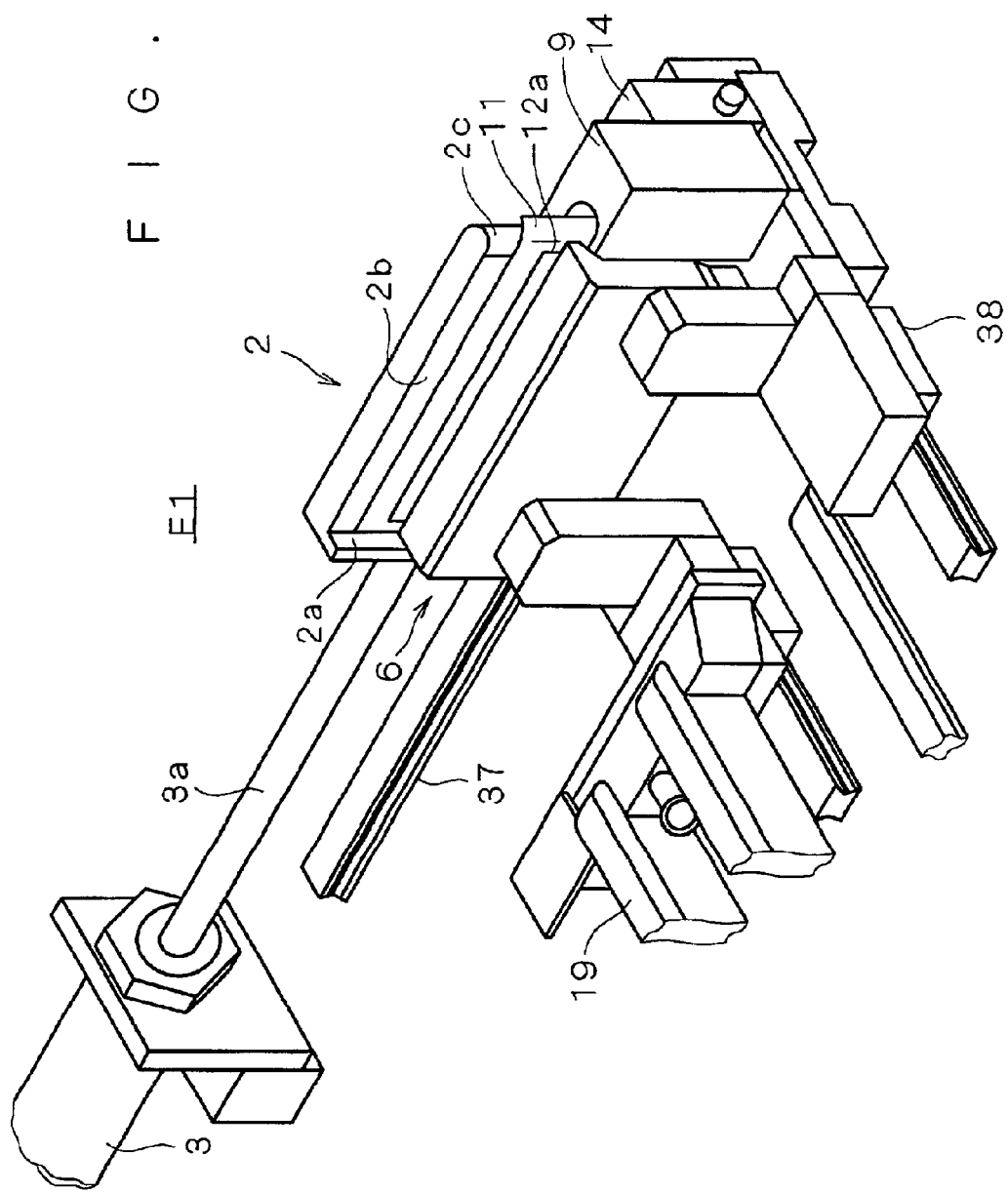
FIG. 9 is a perspective view showing the bar code receiving mechanism after completion of positioning.

FIG. 9 is a perspective view showing the bar code receiving mechanism E1 after completion of positioning of the main bar code label 12a on the sheet 11. As is apparent from the drawing, the main bar code label 12a on the sheet 11 is positioned and held by the backing plate 2 and the positioning plate 6, and an end of the sheet 11 is inserted in between the backing plate R portion 2c and the R guide 9. A rail 37 is provided to cause the receiving base 14 moving thereon to run smoothly, and a supporting base 38 is provided to support the positioning plate 6.

(Work Holding Operation)

Figure 10:
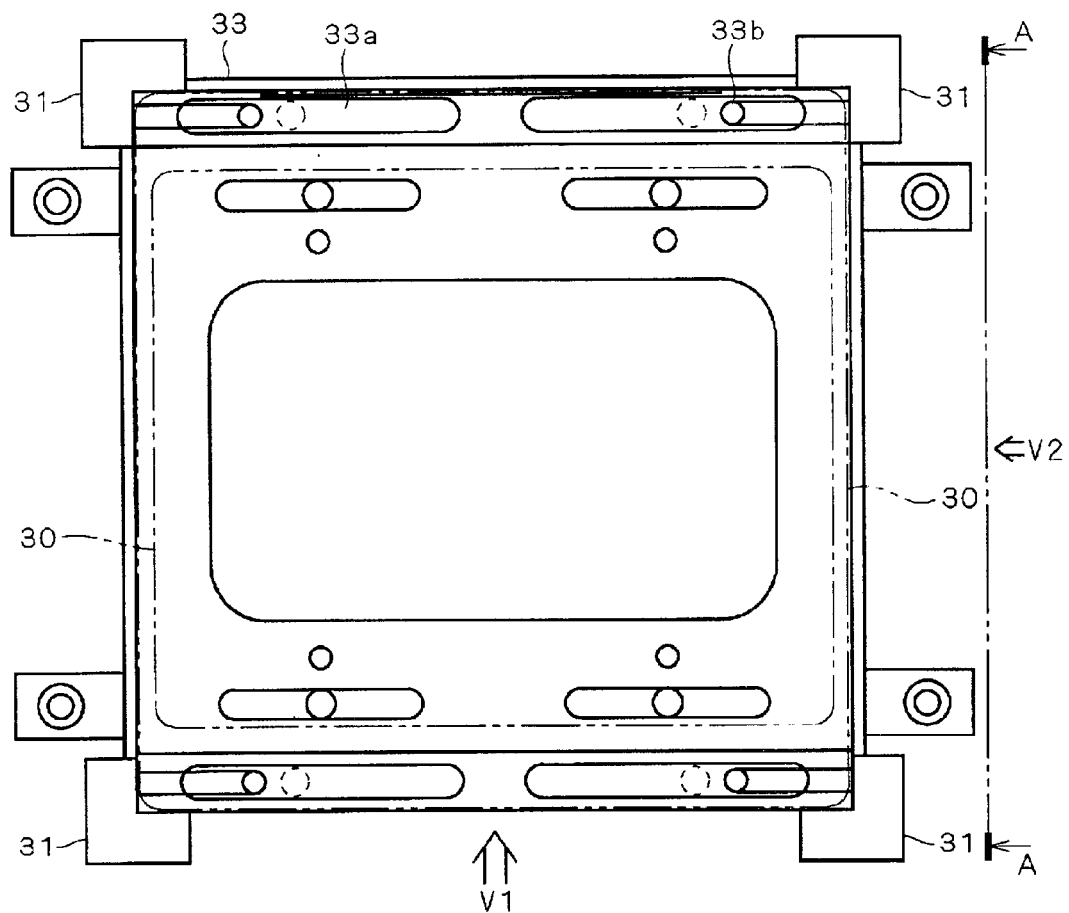
FIG. 10 is a plan view showing a detailed structure of a work holding mechanism.
Figure 11:
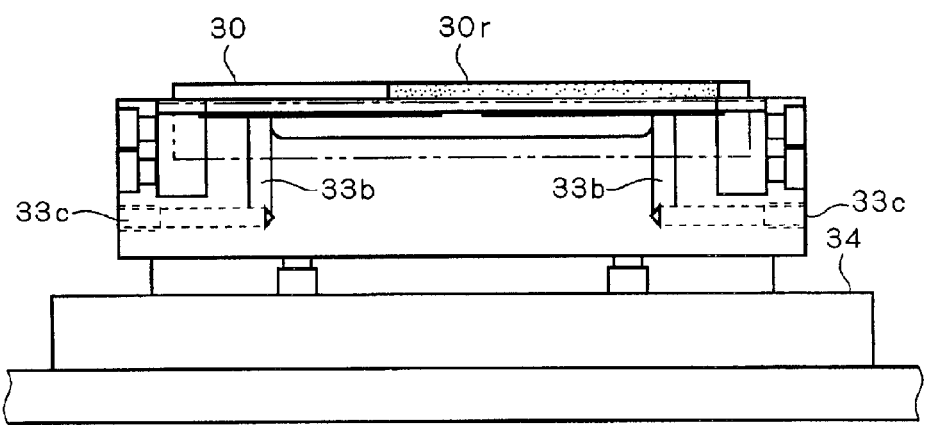
FIG. 11 is a front view showing the detailed structure of the work holding mechanism.
Figure 12:
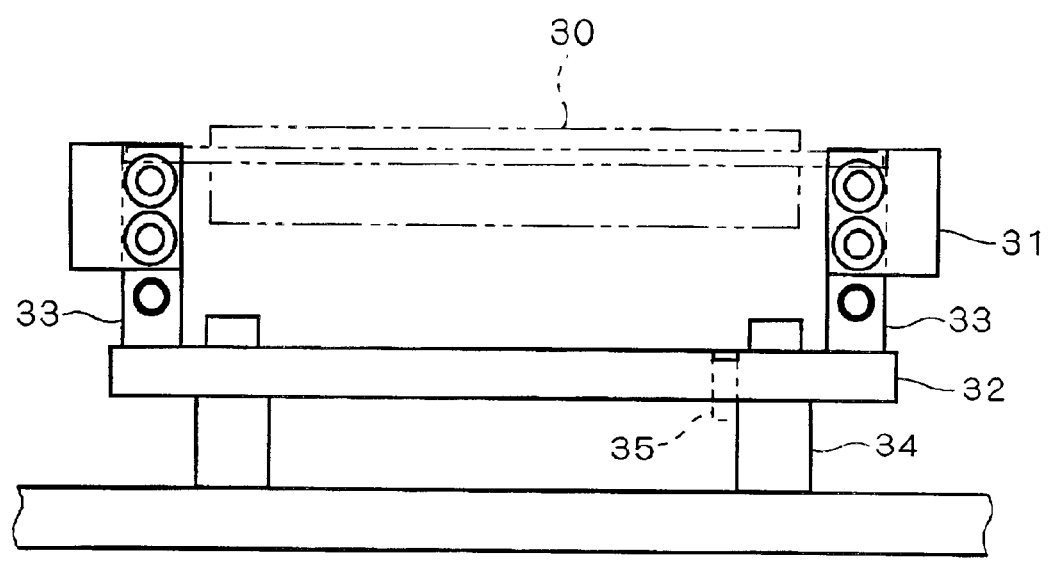
FIG. 12 is a side view showing the detailed structure of the work holding mechanism.

FIGS. 10 to 12 are views showing a detailed structure of the work holding mechanism E3. FIG. 10 is a plan view, FIG. 11 is a front view viewed from a point V1 in FIG. 10, and FIG. 12 is a side view viewed from a point V2 in FIG. 10.

As shown in these drawings, a foot plate 34 is provided on the base board 4. A relay plate 32 is provided on the foot plate 34. The adsorbing block 33 which is rectangular in plane figure having an opening on its upper portion is provided on the relay plate 32. An adsorbing slot 33a is provided on the adsorbing block 33, and an adsorbing hole 33b is provided inside the adsorbing slot 33a.

A guide 31 made of Teflon® is provided correspondingly to each corner of the adsorbing block 33. The guide 31 allows a work 30 such as a reticle which is a target on which a bar code is labeled to be arranged on the adsorbing block 33 with high positional accuracy. Part of a side face of the work 30 becomes a bar-code to-be-labeled region 30r.

Provided under each guide 31 is a vacuum inlet 33c through which a vacuum pressure can be created in the inside of the adsorbing hole 33b.

Figure 13:
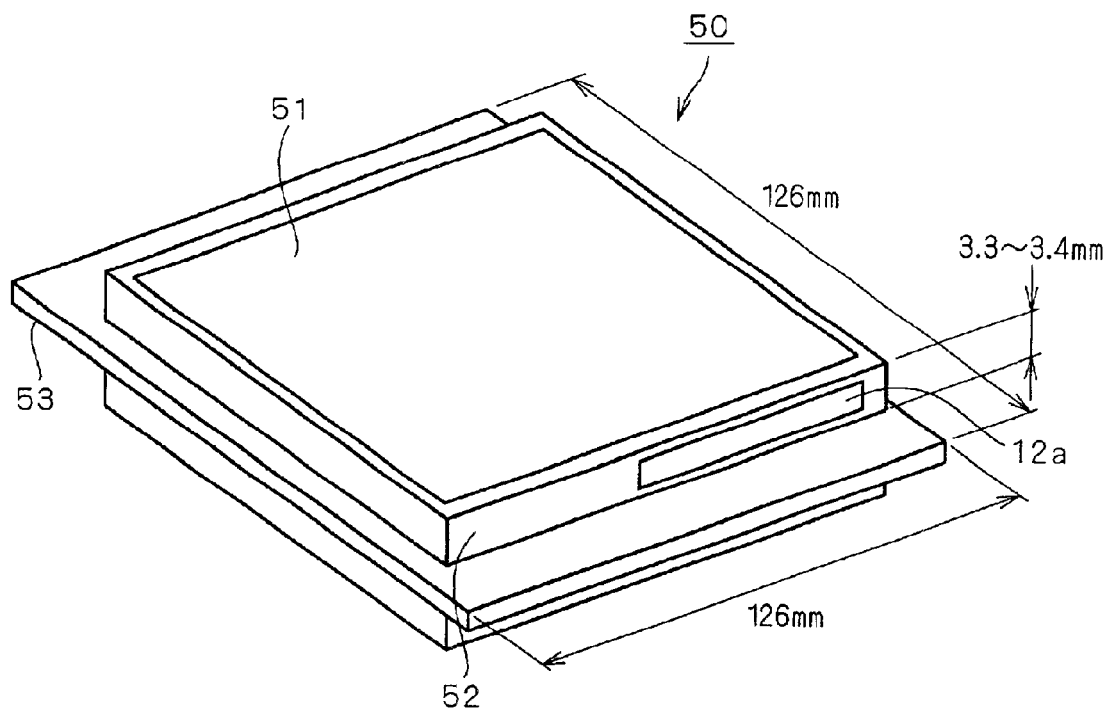
FIG. 13 is a perspective view showing a structure of a reticle.

FIG. 13 is a perspective view showing a structure of a reticle which exemplifies the work 30. As shown in the drawing, a reticle 50 includes a pellicle 51, a pellicle frame 52 surrounding four sides of the pellicle 51, a reticle body 53 and the like. Part of the pellicle frame 52 forming upper side faces of the pellicle 51 has a width of approximately 126 mm and a height (i.e., a dimension that labeling is possible) of approximately 3.3 to 3.4 mm. The main bar code label 12a is affixed to the pellicle frame 52.

Figure 14:
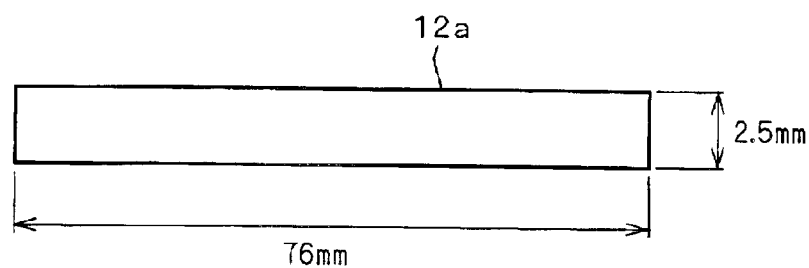
FIG. 14 is an explanatory view showing dimensions of the main bar code label.

FIG. 14 is an explanatory view showing dimensions of the main bar code label 12a. As shown in the drawing, the main bar code label 12a has a width of approximately 76 mm, a height of approximately 2.5 mm, a thickness of approximately 0.8 mm and a weight of approximately 0.01 to 0.02 g.

With such dimensions, a starting button not shown having a lighting function is pressed to be turned on and a vacuum pressure is created in the inside of the adsorbing hole 33b through the vacuum inlet 33c provided under each guide 31. This allows the work 30 mounted on the adsorbing block 33 to be adsorbed and held.

(Bar Code Adsorbing Operation)

Figure 15:
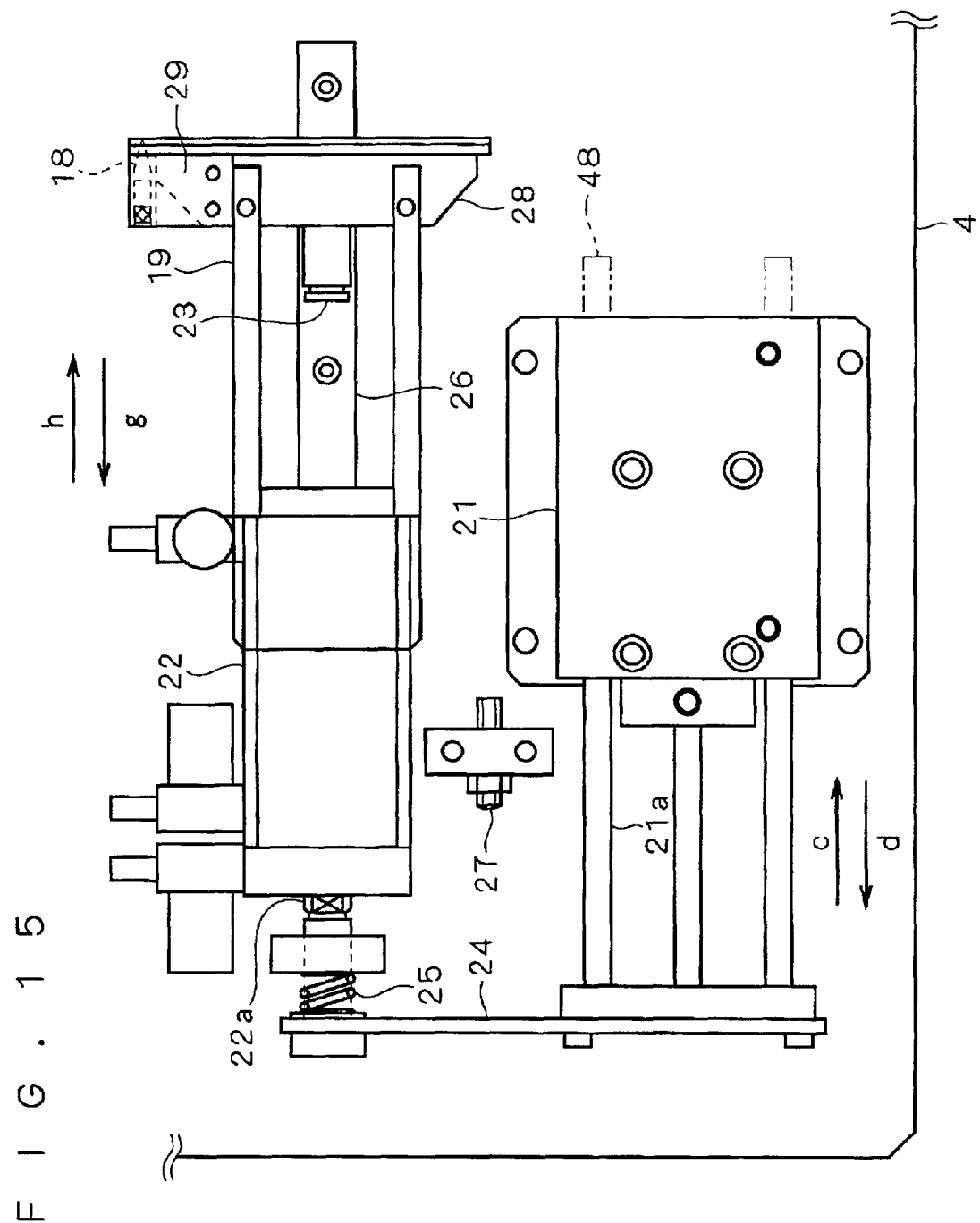
FIG. 15 is a plan view showing a detailed structure of a bar code adsorbing mechanism.
Figure 16:
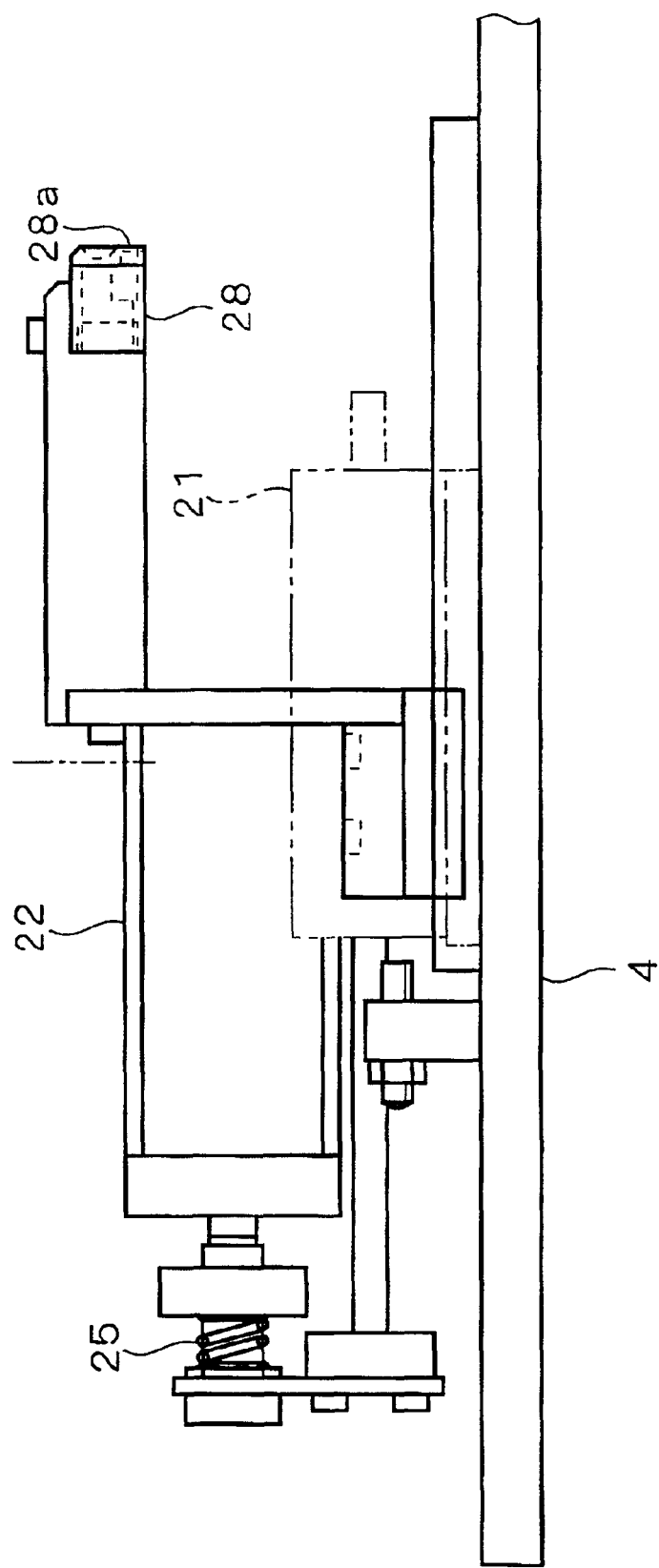
FIG. 16 is a front view showing the detailed structure of the bar code adsorbing mechanism.

FIG. 15 is a plan view showing a detailed structure of the bar code adsorbing mechanism E2, and FIG. 16 is a front view showing the detailed structure of the bar code adsorbing mechanism E2.

As shown in these drawings, the cylinder 21 has a cylinder rod 21a connected to a cylinder rod 22a of the cylinder 22 through a connecting plate 24 and a spring 25. The cylinder rod 22a is moved in the direction of an arrow c or d to cause the cylinder 22 to move in the direction of an arrow g or h.

Further, an adsorbing (pad) part 28 having a needle block 29, a needle 18, an adsorbing ports 28a and the like is attached to a front end of a moving part of the cylinder 22 by a supporting plate 19.

With such structure, while the work holding mechanism E3 adsorbs and holds the work 30, the cylinder rod 21a is moved in the direction of the arrow c, so that the motion is transmitted through the connecting plate 24 to cause the cylinder (ASSY) 22 on the whole to move slidably along the bearing 26. The connecting plate 24 is stopped by the stopper bolt 27, and a front end of the cylinder rod 21a reaches an endpoint position 48, at which time the work 30 is positioned such that the adsorbing part 28 to be described later is brought into intimate contact with a surface of the main bar code label 12a.

A vacuum pressure is created in the inside of the adsorbing ports (pads) 28a of the adsorbing part 28 attached to the front end of the moving part of the cylinder 22 through the vacuum port 23, thereby adsorbing the main bar code label 12a with an adsorbing force exerted by the adsorbing ports 28a. The adsorbing ports 28a, being made of an elastic body such as rubber, do no damage to the main bar code label 12a.

At the vacuum adsorption of the main bar code label 12a performed by the adsorbing ports 28a in the above-described stop position, the spring 25 provided at an end of the cylinder rod 22a absorbs a shock caused when coming into contact with the backing plate flat portion 2b to prevent the adsorbing ports 28a and the backing plate flat portion 2b from being damaged, thereby assisting the vacuum adsorption of the main bar code label 12a to be performed smoothly.

Figure 17:
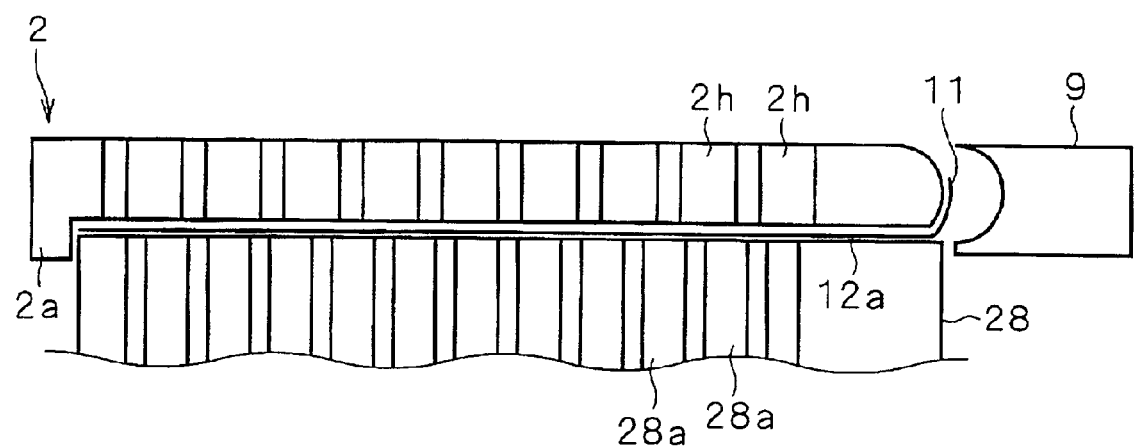
FIG. 17 is a plan view showing a state in which the main bar code label is adsorbed.
Figure 18:
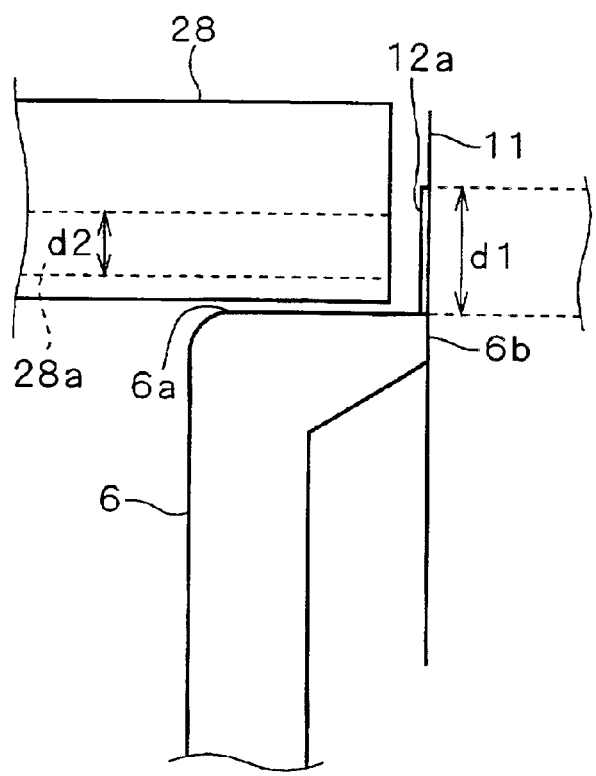
FIG. 18 is a front view showing the state in which the main bar code label is adsorbed.

FIGS. 17 and 18 show a state in which the main bar code label 12a is adsorbed. FIG. 17 is a plan view viewed from above and FIG. 18 is a front view viewed from sideways.

As shown in these drawings, the stop position of the adsorbing part 28 is determined such that the adsorbing part 28 is positioned over the stopper portion 6a of the positioning plate 6 and is opposed to the main bar code label 12a. More specifically, the stop position is determined such that the plurality of adsorbing ports 28a each have a diameter d2 (e.g., 1.5 mm) smaller than a width d1 (e.g., 2.5 mm) of the main bar code label 12a and are positioned in a center portion of the main bar code label 12a.

The plurality of adsorbing ports 28a are provided along a direction of the width of the main bar code label 12a. The backing plate 2 is also provided with through holes 2h along the direction of the width of the main bar code label 12a. The through holes 2h are provided for the backing plate 2 for improving stability in adsorption.

Further, at the adsorption, a left upper portion of the sheet 11 is stuck by the needle 18 equipped with the adsorbing part 28, thereby preventing the sheet 11 from being displaced with reliability. Since the needle 18 is merely stuck at a single location in the left upper portion of the sheet 11, the sheet 11 is released from the state stuck by the needle 18 as the backing plate 2 is moved in a removing operation of the sheet 11.

As has been described, the adsorbing part 28 determined in the stop position with high accuracy adsorbs the main bar code label 12a with high accuracy and stability.

(Bar Code Removing Operation)

Figure 19:
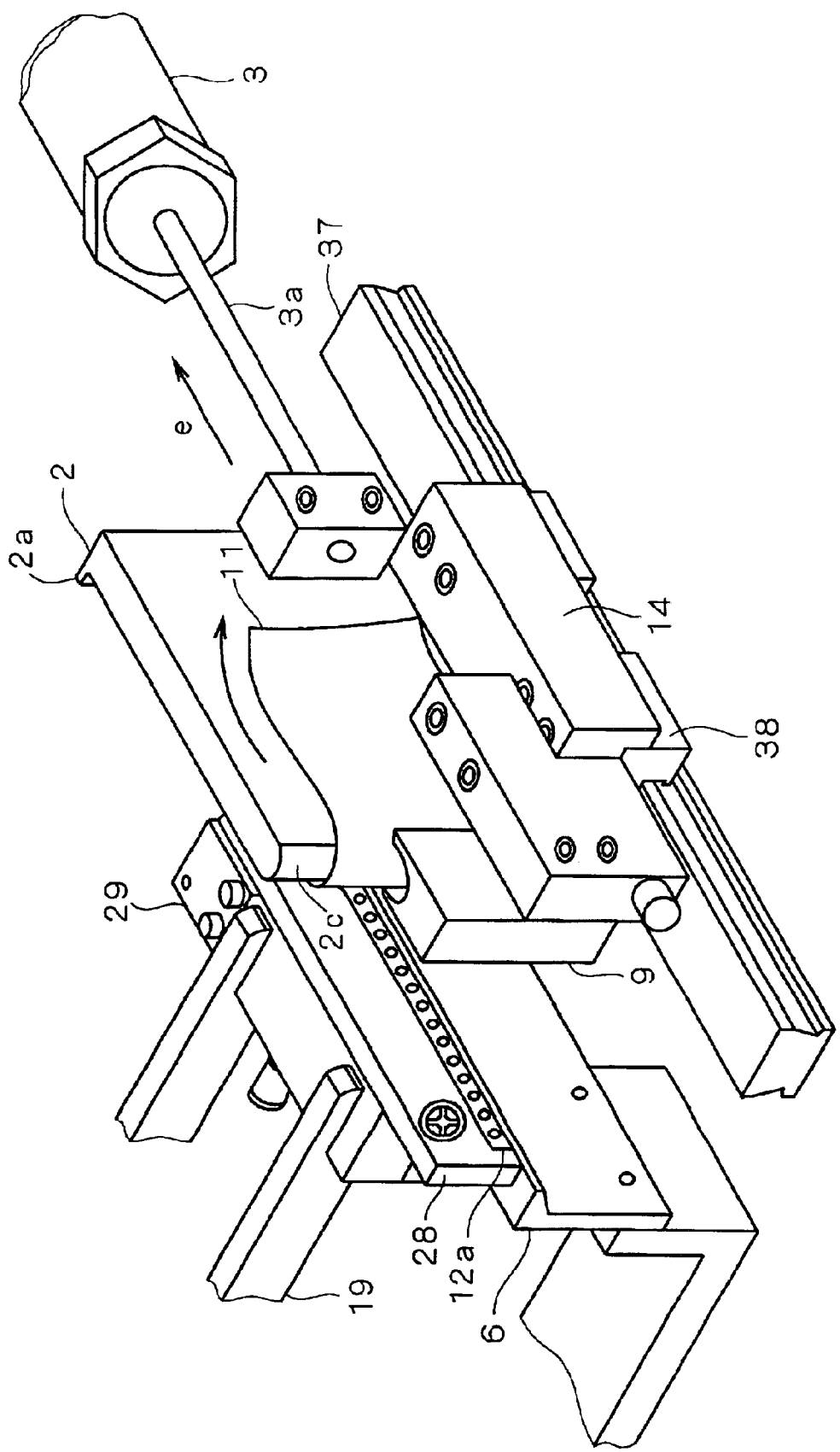
FIG. 19 is a perspective view showing a state in which the main bar code label is halfway removed.
Figure 20:
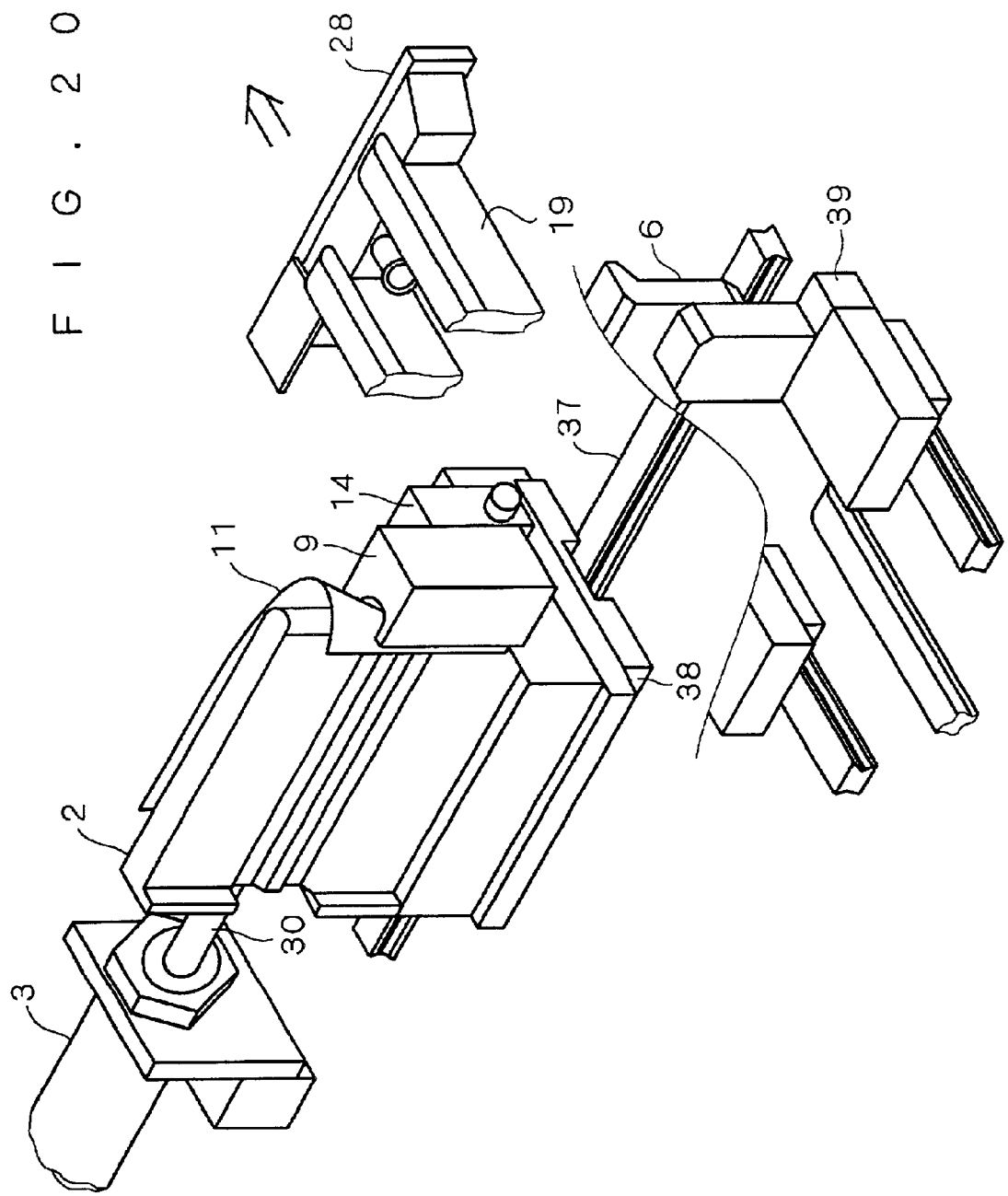
FIG. 20 is a perspective view showing a state in which the main bar code label is completely removed.

FIG. 19 is a perspective view showing a state in which the main bar code label 12a is removed halfway. FIG. 20 is a perspective view showing a state in which the main bar code label 12a is removed completely. With reference to these drawings, a removing operation of the main bar code label 12a from the sheet 11 will be described below.

Upon confirming adsorption of the main bar code label 12a by the adsorbing part 28, the cylinder rod 3a of the cylinder 3 of the bar code receiving mechanism E1 is moved in the direction of the arrow e. Then, the receiving base 14 and the backing plate 2 both connected to the cylinder rod 3a are moved correspondingly.

In consequence, as shown in FIG. 19, a sheet moving operation is performed in which the sheet 11 inserted in between guides of the backing plate R portion 2c and the R guide 9 is moved while being reversed between these guides as if pulled by the moving backing plate 2. This allows the sheet 11 to be removed from the main bar code label 12a without affecting the adsorption of the main bar code label 12a at al. There arises no problem if the main bar code label 12a is a narrow rectangle with its shorter side being not more than 2.5 mm. Since the end of the main bar code label 12a is removed by approximately 5 to 10 mm by the bar code label partly removing operation, the sheet 11 can be removed smoothly from the main bar code label 12a.

At last, as shown in FIG. 20, the sheet 11 is completely removed from the main bar code label 12a while the main bar code label 12a is maintained adsorbed by the adsorbing ports 28a.

Referring back to FIG. 7, at the removal of the main bar code label 12a, an ionizer 16 continuously supplies ionic wind toward the temporary bar code label 12 and a region in the vicinity thereof. This can prevent without fail occurrence of an adsorption error due to a displacement of the main bar code label 12a created by static electricity.

(Bar Code Labeling Operation)

Figure 21:
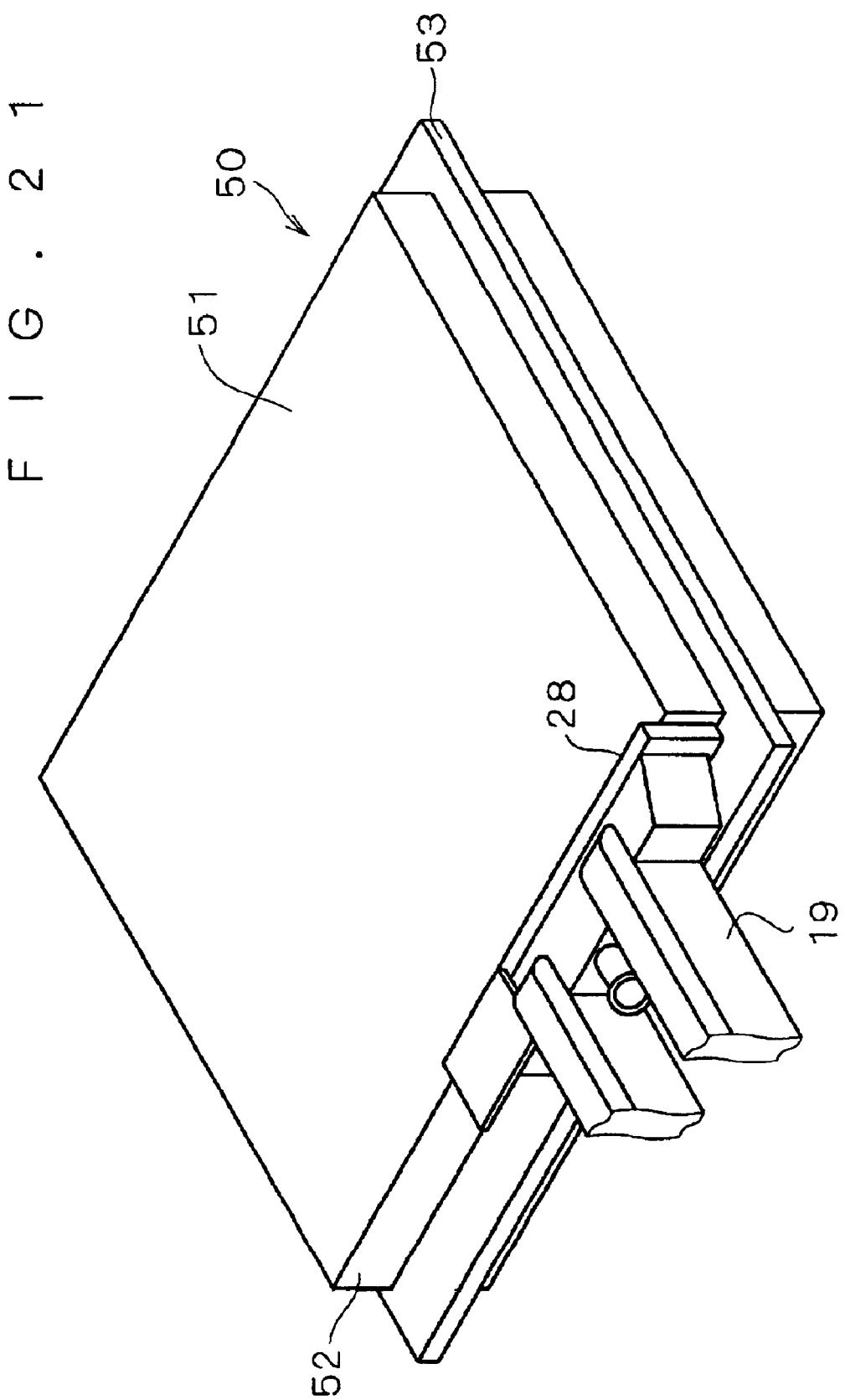
FIG. 21 is a perspective view showing a process of affixing the main bar code label.

FIGS. 21 and 22 show a labeling operation of the main bar code label 12a onto the reticle 50. FIG. 21 is a perspective view and FIG. 22 is a sectional view.

As shown in these drawings, after removing the sheet 11 from the main bar code label 12a, the cylinder 22 moves the adsorbing part 28 such that the back side (adhesive surface) of the main bar code label 12a is opposed to the bar-code to-be-labeled region of the pellicle frame 52 in the state that the main bar code label 12a is subjected to the vacuum adsorption through the adsorbing ports 28a.

At this time, as shown in FIG. 22, the sum (d1+d3) of the width d1 of the main bar code label 12a and a distance d3 (e.g., 0.5 mm) between the lowest edge of the main bar code label 12a and that of the adsorbing part 28 is set to be somewhat smaller than a height d4 (e.g., 3.5 mm) of the pellicle frame 52, which allows the adsorbing part 28 to be moved onto the pellicle frame 52 having the height d4 with high positional accuracy.

Next, the main bar code label 12a is pressed precisely against the pellicle frame 52 so as to be precisely affixed to the to-be-labeled region of the pellicle frame 52. At this time, the spring 25 absorbs a shock caused when the reticle 50 and the adsorbing part 28 come into contact, which allows the main bar code label 12a to be smoothly affixed to the pellicle frame 52.

After the labeling operation of the main bar code label 12a is completed normally, the cylinder 22 of the bar code adsorbing mechanism E2 is moved in the direction of the arrow g (FIG. 15) and the cylinder rod 21a in the direction of the arrow d, thereby causing the bar code adsorbing mechanism E2 to return to a position in an initial state.

During the above-described series of operations, the aforementioned start button is in an ON state. Pressing the start button again after removing the sheet 11 causes the cylinder rod 3a of the bar code receiving mechanism E1 to return to an initial setting position in the direction of the arrow f, and at the same time, holding of the work 30 (i.e., the reticle 50) with the vacuum adsorption performed by the bar code adsorbing mechanism E2 is released, so that one cycle of operations is completed.

When affixing the main bar code label 12a, the ionizer 16 continuously supplies ionic wind toward the main bar code label 12a and a region in the vicinity thereof as in the removing operation of the main bar code label 12a. This can prevent without fail occurrence of an adsorption error due to a displacement of the main bar code label 12a created by static electricity.

(Bar Code Reading Operation)

In manufacturing plants of integrated circuits or the like, a process similar to a photolithography process is conducted, and an apparatus for transferring a reticle (mask) to a wafer is used in the process. Operators have conventionally confirmed identification information containing characters and the like marked on a reticle in the process as necessary. However, the identification information contains ten or more characters, and is thus difficult to identify visually. Besides, similar pieces of identification information containing similar characters and the like exist among several hundreds to several thousands of reticles, which have frequently caused errors in identifying identification information. However, as described above, the achievement of precise affixing of the main bar code label even to the reticle which is a small work makes it possible to read a bar code by a dedicated bar code reader, not by operator's visual identification.

FIG. 23 is an explanatory view showing an operation of reading the main bar code label which is a second basic principle of the present invention. As shown in the drawing, a stationary bar code reader 41 is provided on a support 40 in a position away from the main bar code label 12a affixed to the reticle 50. The bar code reader 41 is fixed in such a manner that laser 44 from the bar code reader 41 is radiated onto the main bar code label 12a at an angle of approximately 15° relative to the horizontal direction.

Upon radiation of the laser 44 onto the main bar code label 12a from the stationary bar code reader 41, remote control is performed for detecting reflected light from the main bar code label 12a, which allows the stationary bar code reader 41 to precisely read identification information (bar code information) of the reticle 50 defined by the bar code printed on the main bar code label 12a. It is therefore possible to reduce errors in identifying reticles to zero, allowing remarkable suppression of an economic loss due to such identification errors.

Although FIG. 23 exemplifies the bar code reading operation performed by the stationary bar code reader 41, a hand-held portable input unit having a bar code reading function which will be described later may be used to read a bar code.

(Others)

Although the first and second basic principles have described the reticle as a small work, the reticle, as a matter of course, is applicable to another small work having a bar-code to-be-labeled region only enough to be labeled with a bar code of not more than 3 mm in height.

Further, in place of the plurality of adsorbing ports 28a of the adsorbing part 28, an adsorbing port formed by inserting a material of porous structure into an opening which is a size smaller than the main bar code label 12a may be used to adsorb the main bar code label 12a.

<Preferred Embodiment>

FIG. 24 is an explanatory view showing a structure of a production control system according to an embodiment of the present invention.

As shown in the drawing, an operator inputs various types of data on manufacturing processes of semiconductor devices using a portable input unit 61 called "Handy" which is a data input unit having portability. The portable input unit 61 has a bar code reading function for performing data input mainly by reading a bar code, and is equipped with a key board 61a containing various keys for inputting data other than bar codes and a display 61b for checking data values and the like.

The portable input unit 61 is placed in a predetermined condition in a terminal (data reading mechanism) 62 of a production line terminal 63 provided in a predetermined position of a production line, so that input data D1 input to the portable input unit 61 is transferred to the production line terminal 63. Compilation data D3 obtained by performing a compiling process (production controlling process) in the production line terminal 63 which is a data processor based on comparison between the input data D1 and master data D5 is transmitted to a server 65 via a LAN cable 64. The master data D5 (including product information data) serving as a reference value for production control is transmitted from the server 65 which is a reference value data transfer system via the LAN cable 64.

Figure 25:
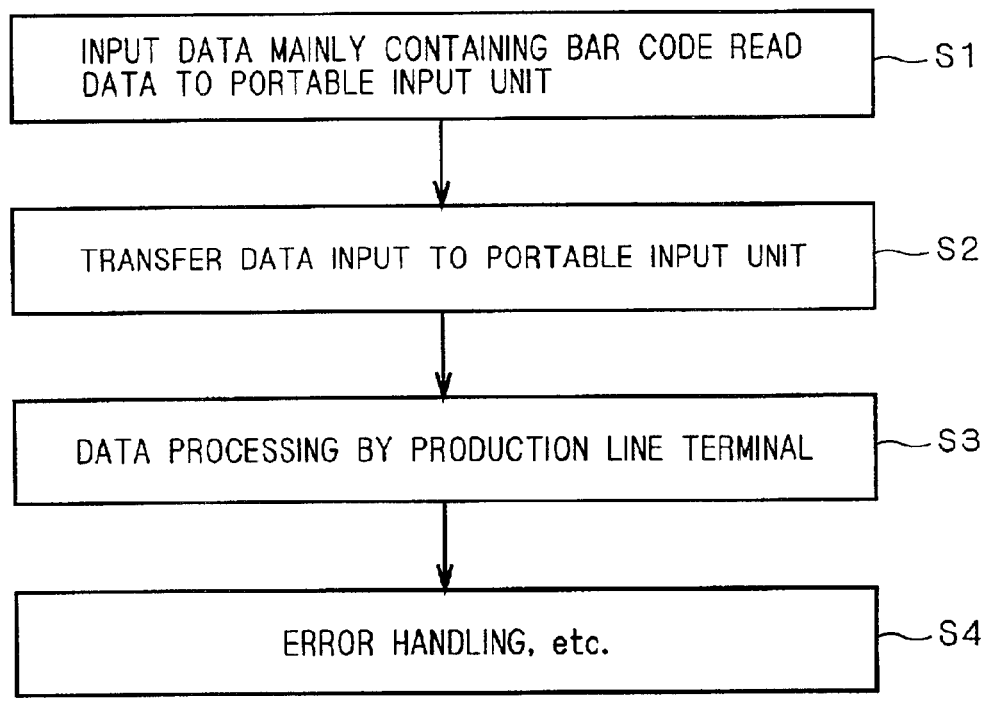
FIG. 25 is a flow chart showing a production controlling method according to the production control system.

FIG. 25 is a flow chart showing a production controlling method according to the production control system. Referring to the chart, data on manufacturing processes of semiconductor devices mainly containing bar code read data are input to the portable input unit 61 in step S1. According to the production control system of the present embodiment, as much data on manufacturing processes as possible are input by reading bar codes.

FIG. 26 is an explanatory view showing an example of a data form used for each product. As shown in FIG. 26, a data form 70 is filled with a key number bar code 71, a key number 72, a chip name 73, a lot number 74 and the like. The key number 72 is a unique identification number determined by the chip name 73, the lot number 74 and the like.

An operator reads the key number bar code 71 using the portable input unit 61, thereby achieving precise data input of the key number 72, i.e., the chip name 73 and the lot number 74.

FIG. 27 is an explanatory view showing an example of a bar code list. As shown in FIG. 27, a bar code list 76 contains an Ar pressure code group 76a, a voltage code group 76b, a film thickness code group 76c, a foreign substance code group 76d and a film thickness difference code group 76e. A bar code corresponding to inspection data is read out from each of the code groups, which enables precise data input of an inspection value.

As described, data input performed by the portable input unit 61 mainly by reading bar codes can achieve easy and precise data input.

Figure 28:
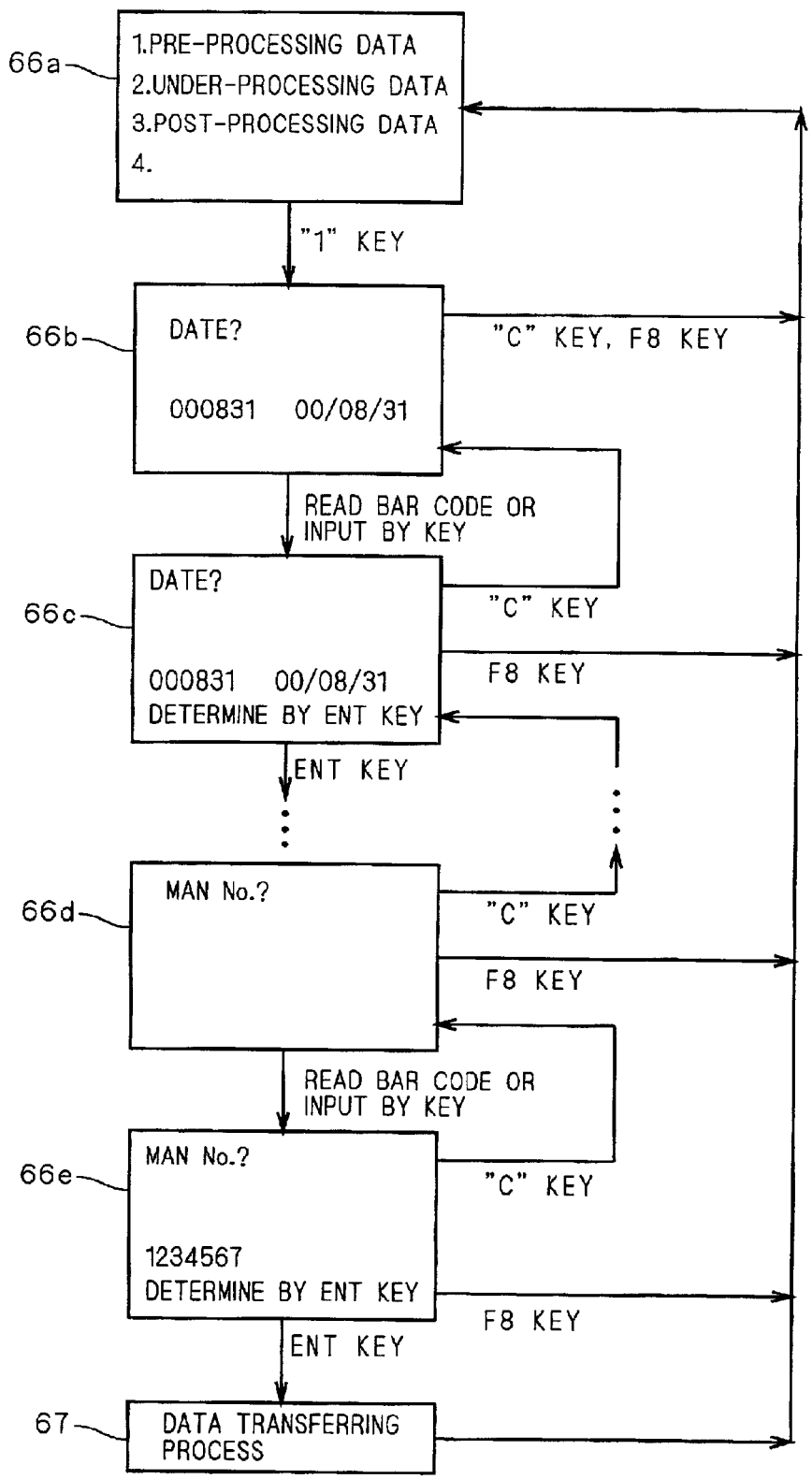
FIG. 28 is an explanatory view showing an example of operations performed on a display screen of a portable input unit.

FIG. 28 is an explanatory view showing an example of operations performed on a display screen of the portable input unit 61. As shown in FIG. 28, a display screen 66a displays "1. pre-processing data", "2. under-processing data" and "3. post-processing data" as a menu display.

When "1" is input, the screen is shifted to a display screen 66b, in which a date asking display is executed. Since the portable input unit 61 has a timing function, there is no need to input a date under normal circumstances.

In the state of the display screen 66b, input of data on a series of manufacturing processes is performed mainly by inputting bar code data including reading of the key number bar code 71 from the data form shown in FIG. 26.

Data input is determined by pressing an ENT (enter) key in the state of the display screen 66b. Completion of a series of data input is followed by a process of inputting the man number of an operator on a display screen 66d.

Figure 29:
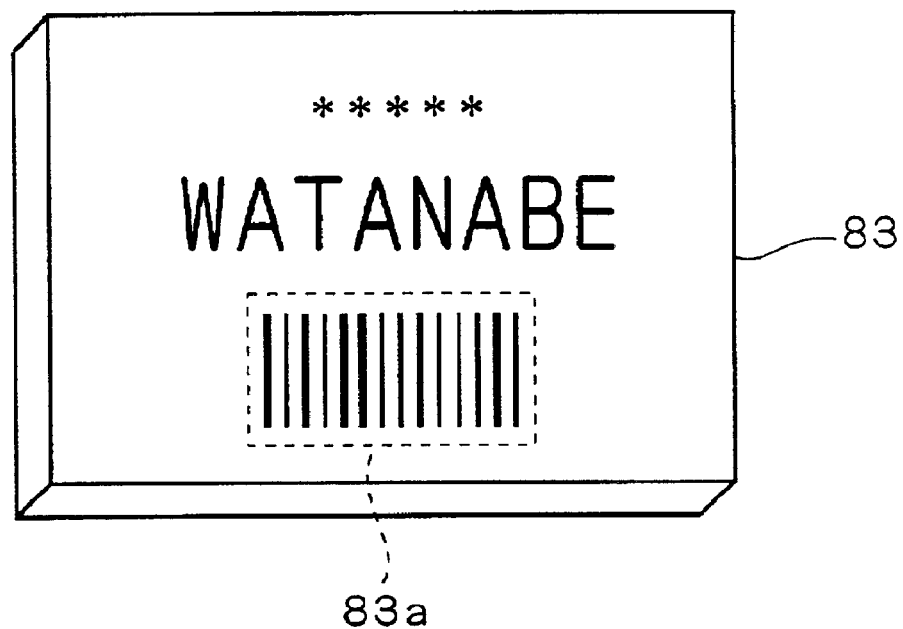
FIG. 29 is an explanatory view showing an example of a name plate of an operator.

FIG. 29 is an explanatory view showing an example of a name plate of an operator. As shown in FIG. 29, a name bar code 83a for specifying an operator's name "WATANABE" is printed on the name plate together with the operator's name. Reading the name bar code 83a by the portable input unit 61 allows operator's data to be input precisely.

Next, a display screen 66e displays the man number. The operator checks it and presses the ENT key, so that input of the pre-processing data is completed, which is followed by a data transferring process 67.

The data transferring process 67 means a process for transferring data on manufacturing processes input to the portable input unit 61 to the production line terminal 63 by placing the portable input unit 61 in the terminal 62 in a predetermined condition.

Each display screen can be returned to a previous screen by pressing a "C" (cancel) key and to the menu display by pressing an "F8" (menu) key.

FIG. 30 is an explanatory view showing the concept of a pre-processing product, an under-processing product and a post-processing product. As shown in FIG. 30, a product before being subjected to manufacturing processes in a semiconductor manufacturing apparatus 87 is an unprocessed product 86a, a product under the manufacturing processes in the semiconductor manufacturing apparatus 87 is the under-processing product, and a product after the manufacturing processes in the semiconductor manufacturing apparatus 87 are completed is a processed product 86b.

FIG. 31 is an explanatory view showing examples of pre-processing data, under-processing data and post-processing data. As shown in FIG. 31, the pre-processing data on the manufacturing processes of the unprocessed product 86a includes an apparatus number, a key number, the number of unprocessed pieces (of wafers), a man number (operator's number) and the like.

The apparatus number includes component numbers of the reticle 50 and the like used for an exposing apparatus (i.e., one of semiconductor manufacturing apparatuses) shown in FIG. 13, and reading the bar code of the main bar code label 12a allows identification information of the reticle 50 to be input precisely. In other words, the bar code affixing apparatus described in the basic principles can affix the main bar code label 12a with high accuracy to an extremely short bar-code-labeled component such as the reticle 50 having a very narrow bar-code-labeled region of a display width of approximately 3.0 mm which is the narrower width thereof. This allows data input using bar codes to be performed for almost all of components of the semiconductor manufacturing apparatus.

Taking a film forming process in a vacuum as an example, the under-processing data include data indicative of manufacturing conditions obtained from a film forming device such as a pressure value, a voltage value, a gas value, a gas flow rate and the like. An index L1 stands for the vacuum level. Among these pieces of under-processing data, those which can be displayed in bar codes using the bar code list shown in FIG. 27 and the like are all displayed in bar codes, thereby achieving input by bar codes.

The post-processing data on the manufacturing processes of the processed product 86b include data such as the number of processed pieces (of wafers), film thicknesses of semiconductor devices, the number of foreign substances, condition judgment of jigs (a jig for setting wafers, etc.), special remarks and the like. Among these pieces of post-processing data, those which can be displayed in bar codes using the bar code list shown in FIG. 27 and the like are all displayed in bar codes, thereby achieving input by bar codes. Special remarks are input directly from the keyboard of the production line terminal 63.

As has been described, in the present embodiment, the pre-processing data, the under-processing data and the post-processing data on the manufacturing processes before processing, under processing and after processing are input respectively, thereby achieving production control that matches manufacturing conditions. These pieces of data are displayed in bar codes as much as possible, thereby achieving input by bar codes, so that data can be input precisely without errors. This can reduce the possibility of occurrence of input errors which have conventionally been created by operators to substantially zero.

Although FIGS. 30 and 31 show the film forming device as an example of semiconductor manufacturing apparatuses, the same applies to other semiconductor manufacturing apparatuses in a production line.

Referring back to FIG. 25, upon completion of a series of data input by the portable input unit 61, the portable input unit 61 is placed in the terminal 62 in step S2, so that the input data D1 input to the portable input unit 61 are transferred to the production line terminal 63.

Next, data processing is executed in step S3 using a form compiling system of the production line terminal 63. The production line terminal 63 performs the compiling process (production controlling process) based on comparison between the input data D1 obtained form the portable input unit 61 and the master data D5 obtained from the server 65.

FIG. 32 is an explanatory view showing an example of a compiling table. As shown in FIG. 32, a compiling table 80 contains a compiling button group 81 (a pre-processing data compiling button 81*a*, an under-processing data compiling button 81*b* and a post-processing data compiling button 81*c*). Selecting a desired button in the compiling button group 81 by clicking the mouse button, a desired compiling process is executed.

In a pre-processing data compiling process, for example, a key number is expanded into a chip name and a lot number as shown by an arrow 82. In this way, all of data in a data display region 92*a* in the compiling table 80 are data obtained by data input performed mainly by reading bar codes by the portable input unit 61 and obtained by automatic compiling process, which creates few possibility of occurrence of input errors which have conventionally been created by operators.

In addition, data processing is executed by the production line terminal 63 provided independently from the portable input unit 61. This eliminates the necessity to provide the portable input unit 61 itself with a high-level data processing function, which does not impair the portability.

Thereafter, error handling and the like are executed in step S4, following which the processes are completed. When an error is detected, an error message 84 is displayed as shown in FIG. 33 so as to promote data correction on the production line terminal 63.

As has been described, the production control system according to the present embodiment is capable of affixing bar code labels to every semiconductor manufacturing apparatus including components provided therein, thereby minimizing operation errors without creating identification errors of the semiconductor manufacturing apparatuses including components, which enables production control with high accuracy.

Further, according to the present embodiment, as much data to be input as possible are displayed in bar codes to enable bar code input. Bar code input is performed for inputting as much data on manufacturing processes as possible in bar codes such as not only the above-described inspection data, operator's data, pre-processing data, under-processing data and the post-processing data but also data on a product, even if it is a defective, which is classified by the type of defect so as to be input in bar codes as much as possible. This allows operation errors created by data input to be minimized through the entire range of production control.

(Others)

In the compiling process in the production line terminal 63, there may be provided an automatic backup function of compiled data at completion of the compiling process when the post-processing data compiling button 81*c* is selected. Further, a monthly updating function may be provided such that data processing is automatically updated every month in order to perform monthly data compilation. Furthermore, a master data changing function capable of changing the master data D5 stored in the server 65 according to a change in specs of products may be provided.

In addition, a reference value may be stored in advance in the portable input unit 61 itself so as to provide the portable input unit 61 with a simple error checking function at the time of data input.

While the invention has been shown and described in detail, the foregoing description is in all aspects illustrative and not restrictive. It is therefore understood that numerous modifications and variations can be devised without departing from the scope of the invention.

What is claimed is:

1. A production controlling method in manufacturing processes in a semiconductor manufacturing apparatus including a bar-code-labeled component provided with a bar code defining identification information, said bar-code-labeled component including an extremely short bar-code-labeled component having a bar code label affixed thereto, said bar code label being printed with a bar code of not more than 3 mm in height, comprising the steps of:

(a) reading out data on said manufacturing processes in said semiconductor manufacturing apparatus, said data on said manufacturing processes including identification information of said extremely short bar-code-labeled component obtained by reading said bar code on said bar code label; and (b) performing production control based on said data on said manufacturing processes, wherein said step (a) includes a step of reading said bar code on said bar code label and obtaining said data on said manufacturing processes using a data input unit having portability capable of reading said bar code on said bar code label and identifying said identification information of said extremely short bar-code-labeled component.

2. The production controlling method according to claim 1, wherein said step (b) includes the steps of:

(b-1) placing said data input unit with a predetermined reading mechanism;

(b-2) reading out said data on said manufacturing processes inputted to said data input unit through said predetermined reading mechanism; and (b-3) performing production control based on said data on said manufacturing processes read out in said step (b-2) by a data processor provided independently from said data input unit.

3. The production controlling method according to claim 1, wherein said data on said manufacturing processes include pre-processing data, under-processing data and post-processing data of said semiconductor manufacturing apparatus.

* * * * *